(12) United States Patent
Javor et al.

(10) Patent No.: US 11,693,065 B2
(45) Date of Patent: Jul. 4, 2023

(54) SYSTEM AND METHOD FOR MEASURING SECOND ORDER AND HIGHER GRADIENTS

(71) Applicant: Trustees of Boston University, Boston, MA (US)

(72) Inventors: Joshua Javor, Cambridge, MA (US); David Bishop, Brookline, MA (US); David Campbell, Brookline, MA (US); Matthias Imboden, St. Blaise (CH)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 17/692,651

(22) Filed: Mar. 11, 2022

(65) Prior Publication Data
US 2022/0291300 A1     Sep. 15, 2022

Related U.S. Application Data

(60) Provisional application No. 63/300,858, filed on Jan. 19, 2022, provisional application No. 63/300,907, (Continued)

(51) Int. Cl.
*G01R 33/022* (2006.01)
*G01R 33/038* (2006.01)
*G01R 33/00* (2006.01)

(52) U.S. Cl.
CPC ....... *G01R 33/022* (2013.01); *G01R 33/0052* (2013.01); *G01R 33/038* (2013.01); *G01R 33/0385* (2013.01)

(58) Field of Classification Search
CPC . G01R 33/022; G01R 33/0052; G01R 33/038
(Continued)

(56) References Cited

U.S. PATENT DOCUMENTS 3,273,397 A * 9/1966 Forward ............... G01V 3/165
                                                    73/382 R
4,257,001 A     3/1981 Partain et al.
(Continued)

FOREIGN PATENT DOCUMENTS

CN         113597520 A * 11/2021 ............. F16F 15/03

OTHER PUBLICATIONS

Translation of CN 113597520 (Year: 2021).*
(Continued)

*Primary Examiner* — Christopher P McAndrew
(74) *Attorney, Agent, or Firm* — Burns & Levinson LLP; Steven M. Mills

(57) ABSTRACT

A system and method of effectively measuring a change in a gradient of a magnetic field. The systems include a first magnet and a second magnet mechanically coupled together and aligned along a polarization axis. The first magnet and the second magnet are positioned such that a pair of like magnetic poles of the first magnet and the second magnet face in opposite directions. Further, the first magnet and the second magnet are configured to move along the polarization axis in response to a magnetic field. A sensing system is configured to measure a change in a gradient of the magnetic field based on the movement of the first magnet and second magnet along the polarization axis in response to the magnetic field.

19 Claims, 28 Drawing Sheets

Related U.S. Application Data filed on Jan. 19, 2022, provisional application No. 63/159,829, filed on Mar. 11, 2021.

(58) Field of Classification Search
USPC .......................................................... 324/200
See application file for complete search history.

(56) References Cited

U.S. PATENT DOCUMENTS

| | | | |
|---|---|---|---|
| 4,368,430 A | | 1/1983 | Dale et al. |
| 4,700,135 A * | | 10/1987 | Hoenig .............. G01R 33/0358 |
| | | | 324/248 |
| 6,008,641 A * | | 12/1999 | Penfold ................ G01R 33/022 |
| | | | 324/245 |
| 6,054,856 A | | 4/2000 | Garroway et al. |
| 6,084,495 A * | | 7/2000 | Ripingale .............. H01F 13/003 |
| | | | 361/139 |
| 6,231,011 B1 * | | 5/2001 | Chu ...................... B64G 1/283 |
| | | | 244/165 |
| 6,268,726 B1 * | | 7/2001 | Prammer ............. G01N 24/081 |
| | | | 324/309 |
| 6,433,543 B1 | | 8/2002 | Shahinpoor et al. |
| 6,462,540 B1 | | 10/2002 | Kandori et al. |
| 7,688,072 B1 | | 3/2010 | Wiegert et al. |
| 8,627,721 B2 | | 1/2014 | Uwechue |
| 2003/0197433 A1 | | 10/2003 | Cheung et al. |
| 2004/0119569 A1 | | 6/2004 | Norimatsu |
| 2005/0057251 A1 | | 3/2005 | Suits et al. |
| 2007/0096729 A1 | | 5/2007 | Brunson et al. |
| 2007/0290678 A1 | | 12/2007 | Herrmann et al. |
| 2009/0293611 A1 | | 12/2009 | Van Kann et al. |
| 2010/0212676 A1 * | | 8/2010 | Shapiro ................. A61M 37/00 |
| | | | 128/899 |
| 2010/0244819 A1 | | 9/2010 | Johnson et al. |
| 2010/0279374 A1 | | 11/2010 | Sista et al. |
| 2010/0288044 A1 | | 11/2010 | Meyer |
| 2010/0295546 A1 | | 11/2010 | Walther et al. |
| 2011/0138909 A1 | | 6/2011 | Van Kann |
| 2014/0111154 A1 * | | 4/2014 | Roy ........................ H02J 50/90 |
| | | | 320/108 |
| 2014/0120633 A1 * | | 5/2014 | Gandini ............ B01L 3/502761 |
| | | | 422/69 |
| 2016/0084923 A1 * | | 3/2016 | Bai ........................... G07D 7/04 |
| | | | 324/252 |
| 2016/0216353 A1 * | | 7/2016 | Heinen .............. G01R 33/4808 |
| 2017/0176389 A1 * | | 6/2017 | Paulson ................. G01N 27/82 |
| 2017/0200815 A1 | | 7/2017 | Caldeira et al. |
| 2017/0241802 A1 * | | 8/2017 | Ausserlechner ....... G01D 5/145 |
| 2018/0210039 A1 | | 7/2018 | Shalev |
| 2019/0018164 A1 * | | 1/2019 | Slocum .............. G01R 33/0206 |
| 2019/0079141 A1 | | 3/2019 | Marauska et al. |
| 2019/0212299 A1 * | | 7/2019 | Freear ...................... G01V 3/15 |
| 2019/0242956 A1 | | 8/2019 | Przytarski et al. |
| 2019/0317167 A1 * | | 10/2019 | Laborde .............. B01L 3/50273 |
| 2020/0025840 A1 | | 1/2020 | Bickford |
| 2020/0049528 A1 | | 2/2020 | Ausserlechner |
| 2020/0110081 A1 * | | 4/2020 | Gandini ........... G01N 33/54333 |
| 2021/0199431 A1 * | | 7/2021 | Barbier ................... G06F 3/013 |

OTHER PUBLICATIONS

Javor, et al. "100 pT/cm single-point MEMS magnetic gradiometer from a commercial accelerometer" 2020; Microsystems & Nanoengineering; vol. 6; No. 71; 13 pages.

Javor, et al. "A Microtissue Platform to Simultaneously Actuateand Detect Mechanical Forces via Non-Contact Magnetic Approach" Feb. 2021; Journal of Microelectromechanical Systems; vol. 30; No. 1; 9 pages.

Javor, et al. "Analysis of a Casimir-driven parametric amplifierwith resilience to Casimir pull-in for MEMS single-point magnetic gradiometry" Microsystems & Nanoengineering; vol. 7; No. 73; 11 pages.

SQUID (requires cryogenic chamber): Web Page: https://www.elliotscientific.com/Tristan- Technologies-SQUID-Sensors; 2022.

Atomic Magnetometer: Web Page: https://quspin.com/products-qzfm/; 2022.

Magnetoresistive: Web Page: https://product.tdk.com/en/techlibrary/developing/bio-sensor/index.html; 2022.

Halbach Array: Web Page: https://www.stanfordmagnets.com/everything-you-need-to-know-about-halbach-arrays.html; 2022.

Magnetic Levitation: Web Page: https://www.energy.gov/articles/how-maglev-works; 2022.

Magnetic Gears: Web Page: https://www.kjmagnetics.com/blog.asp?p=magnetic-gear; 2022.

Imboden, et al. "Design of a Casimir-driven parametric amplifier" 2014; Journal of Applied Physics; vol. 116; 12 pages.

Stange, et al. "Building a Casimir metrology platform with a commercial MEMS sensor" 2019; Microsystems & Nanoengineering; vol. 5; No. 14; 9 pages.

International Search Report with Written Opinion dated Mar. 11, 2022 in International Patent Application No. PCT/US2022/019963 filed Jun. 16, 2022; 12 pages.

International Search Report with Written Opinion dated Mar. 11, 2022 in International Patent Application No. PCT/US2022/019966 filed Jun. 16, 2022; 12 pages.

International Search Report with Written Opinion dated Mar. 11, 2022 in International Patent Application No. PCT/US2022/019970 filed Jul. 7, 2022; 17 pages.

* cited by examiner

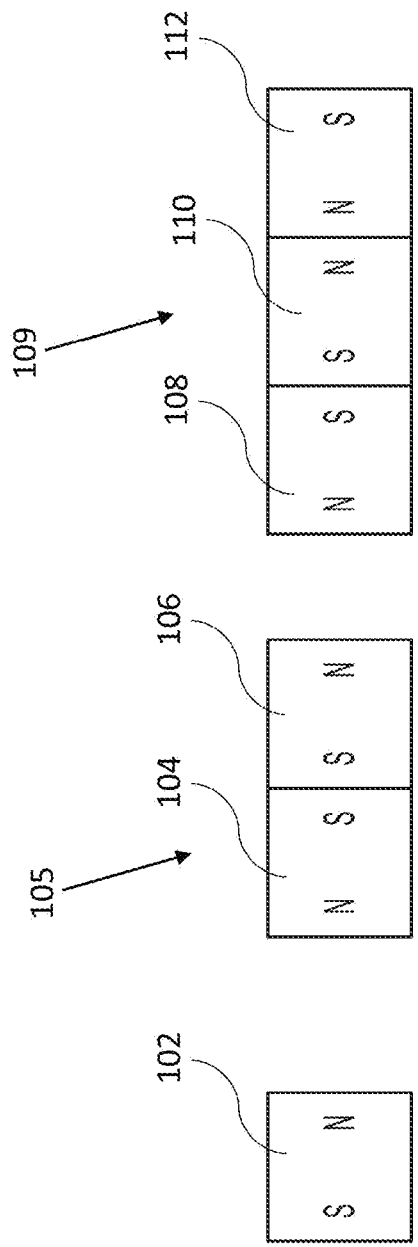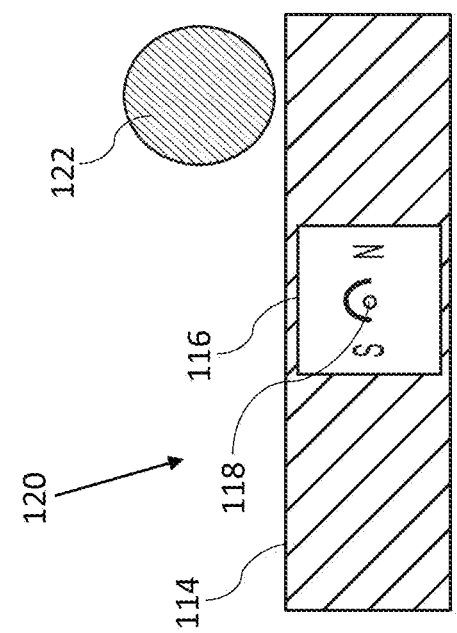

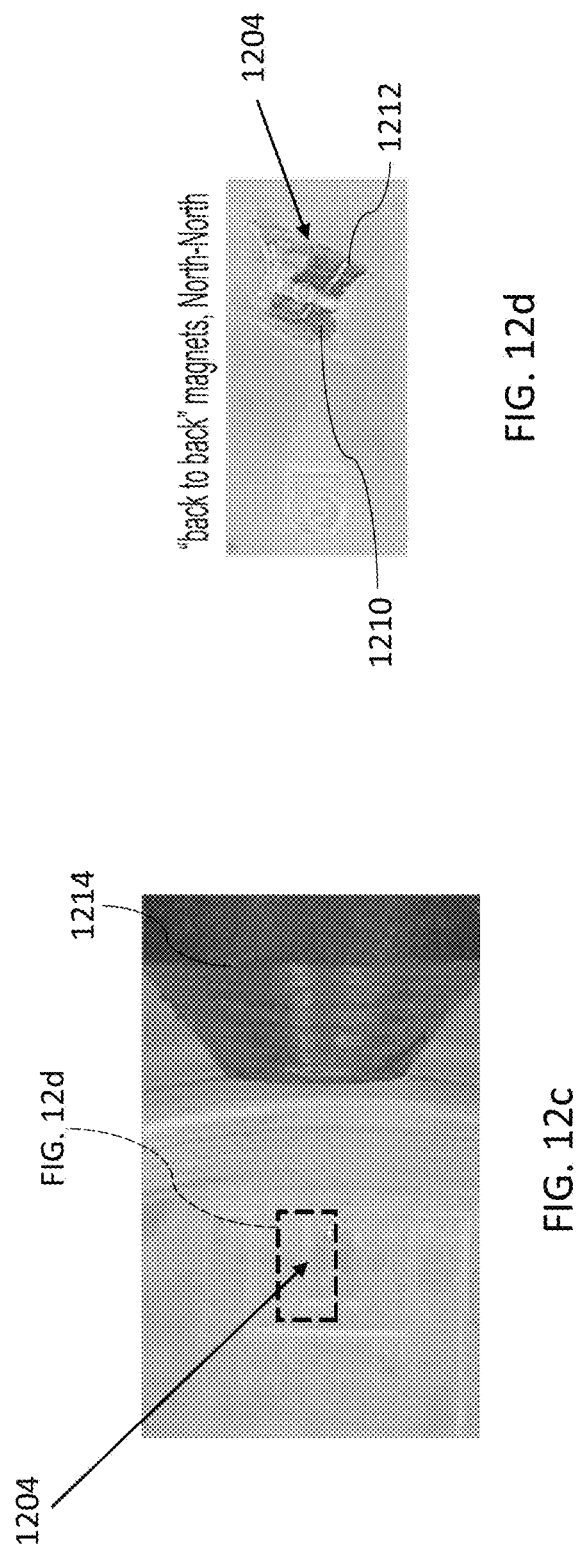

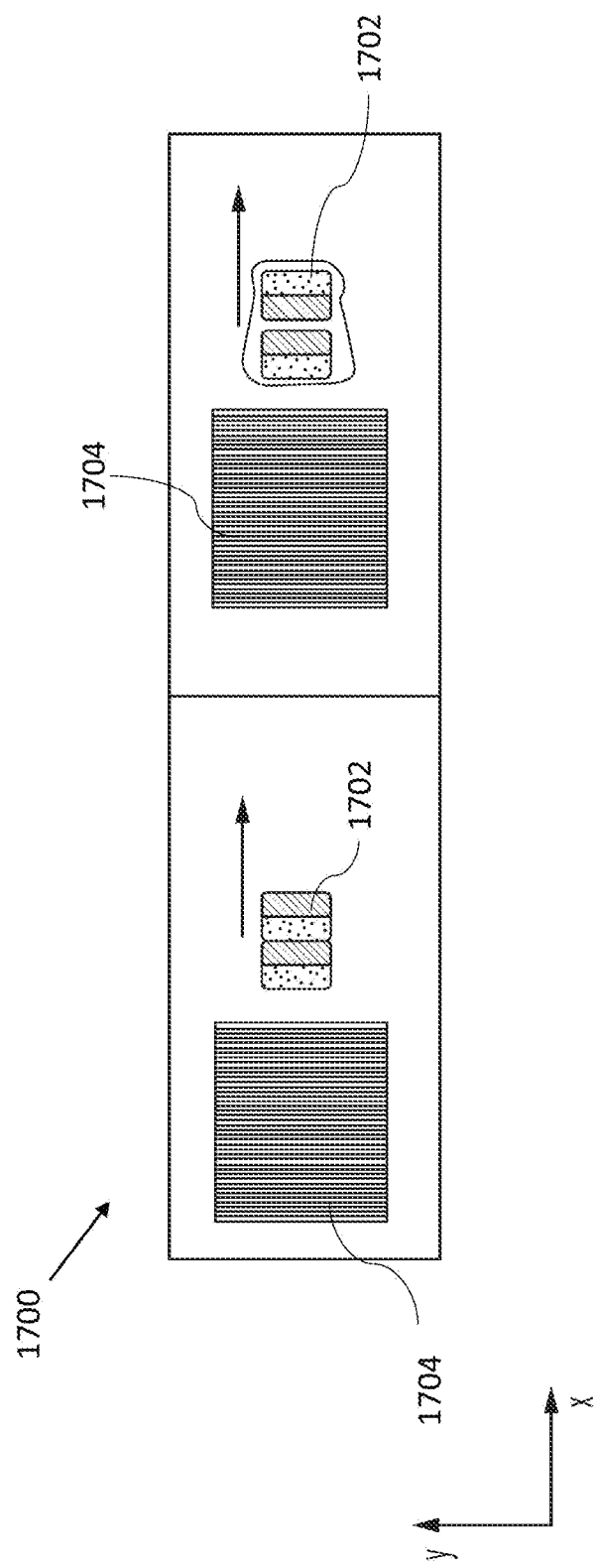

SYSTEM AND METHOD FOR MEASURING SECOND ORDER AND HIGHER GRADIENTS

CROSS REFERENCE TO RELATED APPLICATIONS

This application claims priority to and the benefit of U.S. Provisional Patent Application No. 63/159,829, filed on Mar. 11, 2021, and entitled "CASIMIR-ENABLED QUANTUM MAGNETOMETER", and U.S. Provisional Patent Application No. 63/300,858, filed Jan. 19, 2022, and entitled "HIGHER ORDER GRADIOMETERS AND USES THEREOF", and U.S. Provisional Patent Application No. 63/300,907, filed on Jan. 19, 2022, and entitled "FIRST ORDER SINGLE-POINT GRADIOMETER (FOG) AND USES THEREOF", the contents of which are incorporated herein by reference as though fully set forth herein.

GOVERNMENT SUPPORT

This invention was supported, in whole or in part, with United States government support under Grant No. 1647837 awarded by the National Science Foundation. The United States Government has certain rights in this invention.

FIELD OF THE TECHNOLOGY

The subject disclosure relates to sensing systems configured to measure forces uses gradiometers of the second order or greater.

BACKGROUND OF THE TECHNOLOGY

There is a need for more accurate measurements of magnetic fields. Most existing magnetic sensors detect field intensity. Existing sensors include SQUID sensors, atomic magnetometers, and magnetoresistive sensors. These existing sensors that rely on magnetic field intensities suffer from various inaccuracies, as will be discussed in more detail below.

Existing magnetic arrays comprise the arrangement of permanent magnets to create a custom magnetic field profile for many purposes. The most common is for strong holding applications, such as in robotics, manufacturing, or security. Other applications are for levitation, such as in maglev trains. Yet other applications may utilize arrays for noncontact magnetic gears. The technology disclosed herein is unique in that target actuation in not used, but rather the detection of forces on such permanent magnets/arrays, at micro and nano scales.

Electrocardiogram products are ubiquitous. These technologies involve the contact of electrodes with skin to detect voltage potentials. These potentials are proportional to ionic currents generated by the heart during contraction. Such information is used for screening, diagnosis, performance, and more. The most precise and comprehensive product is the Holter monitor, which typically has the most leads. Body surface mapping also exists, but the large number of electrodes is generally impractical for any applications beyond research. Recent trends show miniaturization of such technologies into two-lead patches over the heart. Wearable watches are also entering this space, with limited diagnostic capability. Products with FDA clearance are emerging related to detection of magnetic fields of the heart, improving triage of patients with chest pain and accuracy of diagnosis. Yet, the technology is greatly limited by the necessity for large instruments with magnetic shielding and specialized facilities.

SUMMARY OF THE TECHNOLOGY

In brief summary, disclosed herein is methodology for detection of sensitive magnetic fields with enhanced immunity from magnetic interference. The subject technology disclosed herein meets the needs described above by enabling miniaturized magnetic sensing in portable and wearable equipment, while improving accuracy of existing sensors.

In at least one aspect, the subject technology relates to a gradiometer having a first magnet and a second magnet mechanically coupled together and aligned along a polarization axis. The first magnet and the second magnet are positioned such that a pair of like magnetic poles of the first magnet and the second magnet face in opposite directions, wherein the first magnet and the second magnet are configured to move along the polarization axis in response to a magnetic field. A sensing system is configured to measure a change in a gradient of the magnetic field based on the movement of the first magnet and second magnet along the polarization axis in response to the magnetic field.

In some embodiments, the change in a gradient of the magnetic field is a second order gradient. In some cases, the change in a gradient of the magnetic field is a higher-than-second order gradient. In some embodiments, the gradiometer includes a third magnet mechanically coupled to the second magnet on a side opposite the first magnet to move along the polarization axis, wherein the third magnet is positioned such that a pair of like magnetic poles of the third magnet and the second magnet face in opposite directions, wherein the change in a gradient of the magnetic field is a third order gradient.

In some embodiments, the first magnet and the second magnet are positioned with a separation distance of substantially 2 mm therebetween. In some cases, the sensing system is a microscope, and the change in gradient is determined based on a change in deflection of the first magnet and/or the second magnet along the polarization axis measured by the microscope. In some embodiments the first magnet and the second magnet are configured to move in mechanical resonance.

In at least one aspect, the subject technology relates to a method of determining a change in a gradient of a magnetic field. The method includes positioning and mechanically coupling a first magnet and a second magnet such that they move together along a polarization axis in response to a magnetic field. The first magnet and the second magnet are aligned along the polarization axis with like magnetic facing in opposite directions. Next, the method includes measuring, with a sensing system, a change in the gradient of the magnetic field based on the movement of the first magnet and the second magnet along the polarization axis in response to the magnetic field.

In some embodiments, the change in the gradient of the magnetic field is a second order gradient and in some cases the change in the gradient of the magnetic field is a higher-than-second order gradient. The method can include mechanically coupling a third magnet to the second magnet on a side opposite the first magnet to move together with the second magnet along the polarization axis. The third magnet can be positioned such that a pair of like magnetic poles of the third magnet and the second magnet face in opposite directions. The change in the gradient of the magnetic field can be a third order gradient.

In some embodiments the first magnet and the second magnet are positioned with a separation distance of substantially 2 mm therebetween. The sensing system can be a microscope and measuring the change in the gradient of the magnetic field can include determining, with the microscope, a change in deflection of the first magnet and/or the second magnet along the polarization axis, wherein the change in the gradient of the magnetic field is determined based on the change in deflection.

In at least one aspect, the subject technology relates to a method of assembling a magnet array for a gradiometer. The method includes attaching a first magnet to a top surface of a first transparent substrate, the first transparent substrate having a greater width than the first magnet. A second magnet is attached to a top surface of a second transparent substrate, the second transparent substrate having a greater width than the second magnet. The second magnet is positioned over the first magnet along a dipole axis. The first magnet is aligned with the second magnet along the dipole axis by viewing the first magnet and second magnet with a microscope from a position directly above the second magnet along the dipole axis and adjusting the position of the first magnet and/or the second magnet. Epoxy is placed on top of the first magnet. The second magnet is lowered onto the first magnet while continuing to view the first magnet and the second magnet with the microscope to maintain alignment along the dipole axis.

In some embodiments, the epoxy is UV curable epoxy which is cured with UV radiation to attach the first magnet and the second magnet. The first magnet is then held to the first transparent substrate with cured UV epoxy and the second magnet is held to the second transparent substrate with cured UV epoxy. In some cases, the first transparent substrate is a glass coverslip and the second transparent substrate is a glass coverslip.

In some embodiments, after the step of lowering the second magnet onto the first magnet, the method includes: curing the epoxy to attach the first magnet to the second magnet; breaking and removing the first transparent substrate from the first magnet; and breaking and removing the second transparent substrate from the second magnet. In some cases, the second magnet is attached to the second transparent substrate with a like polar orientation to the first magnet. The first magnet can be substantially (e.g. +/−10%) the same size as the second magnet.

BRIEF DESCRIPTION OF THE DRAWINGS

So that those having ordinary skill in the art to which the disclosed system pertains will more readily understand how to make and use the same, reference may be had to the following drawings.

FIGS. 1a, 1b, 1c, and 1d show magnet arrangements for gradiometers in accordance with the subject technology.

FIGS. 3b-3d are graphs of the data obtained from the experimental setup of FIG. 3a.

FIGS. 12c, 12d are overhead views of another magnet assembly in accordance with the subject technology.

FIG. 17 is a schematic diagram of a magnet assembly in accordance with the subject technology.

DETAILED DESCRIPTION

Figure 2B:
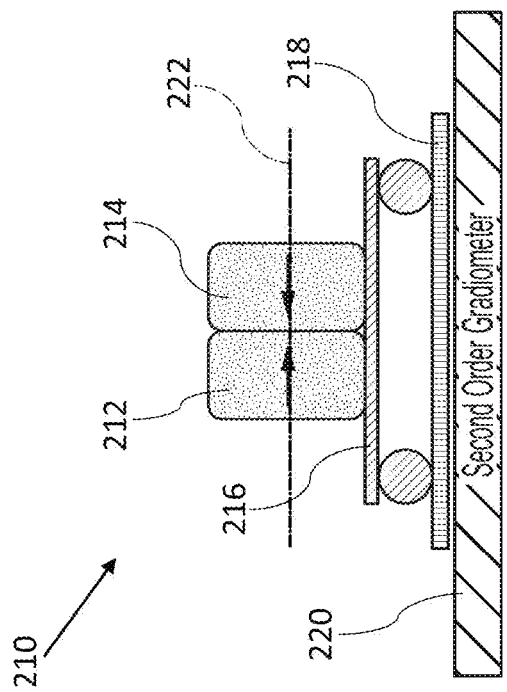
FIG. 2b is a second order gradiometer configured in accordance with the subject technology.

The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e. where an "upper" part must always at a higher elevation).

The subject technology overcomes many of the prior art problems associated with sensing systems, and particularly overcomes problems found in typical force sensors. In brief summary, disclosed herein is methodology for detection of sensitive magnetic fields with enhanced immunity from magnetic interference. All of today's magnetic sensors detect magnetic intensity, which means they are sensitive to all forms of interference, such as the Earth's magnetic field and expansive electromagnetic infrastructure. A large span of techniques have been developed to increase immunity to interference, such as differential sensing with multiple sensors, cryogenic cooling, large magnetically shielded rooms, common mode rejection electronics, and more. The systems and methods disclosed herein enable the measurement of sensitive magnetic fields at a single point, with a single sensor, which have increased immunity to magnetic interference. This is achieved by the direct detection of spatial derivatives of the magnetic field, where a sensor becomes more sensitive to objects in close proximity, and far less sensitive to sources that are farther away.

This technology disclosure builds upon single-point gradiometers (e.g. as disclosed in U.S. Provisional Patent App. No. 63/159,692, incorporated herein by reference) that selectively measure the first order spatial gradient of a magnetic field. Included herein is a discussed of the rationale for the measurement of higher order gradients with single-point gradiometry. Exemplary systems focused on second order gradiometry are disclosed herein in detail, supported by fabrication methods, a measurement system, and results demonstrating the selective measurement of a second order gradient (with immunity to magnetic intensities and first order gradients). The benefits described for first order gradiometers are enhanced with these designs: greater immunity to noise and interference, less post-processing, a path toward a more cost-effective product. The greatest benefit this class of gradiometers offers to sensitive magnetometry is unshielded sensing in ambient environments, a direct product of immunity to magnetic interference. The technology disclosed herein builds on prior technology that detects magnetic field intensities, and instead measures various gradients, allowing for improved accuracy and miniaturization.

Magnetic sensing applications are ubiquitous, especially for high resolution sensors. These applications span medical to consumer, to industrial. In the medical space, leading applications may be in cardiac and cancer imaging. For those applications, the subject technology provides an array of sensors which produce an image of magnetic fields without contact with the patient. In the cardiac case, the magnetic fields describe ionic currents of the heart, analogous to EKGs, but with 3D information and gathered without contact. For cancer imaging, the magnetic fields describe the activity of injected nanoparticles, which identify solid cancerous tumor margins for the purpose of staging and surgically removing cancerous tissue.

In consumer products, iPhones, automobiles, laptops, and the like all contain magnetic sensors. The technology disclosed herein is compatible with semiconductor processes, allowing for integration in those devices. The disclosed sensors may replace existing sensors in some cases, and in other cases may supplement them. The latter is possible as the sensors disclosed herein are directly sensing gradient and higher order gradient magnetic fields, rather than field intensities. This provides valuable information with reduced interference that may aid in enhanced measurement precision in such devices. Measurements may be targeting the Earth's field, rotary components, proximity to magnetic/ferromagnetic components, battery health, or other systems which can be measured through gradients of magnetic fields.

Overall, the technology disclosed herein allows for the detection of spatial gradients of magnetic fields. One may use existing literature or magnetic sensors to measure the spatial profile of a magnetic field from a source, such as that of a human heart or of a ferromagnetic pipeline. Most magnetic field profiles contain many spatial gradients along several axes. The simplest imagination is along the central, easy axis of the source, where one may measure the first order spatial gradient (dB/dx) or the second order spatial gradient (d2B/dx2). Furthermore, combinations of different magnetic arrays and/or sensors would enable sensitivity to a variety of spatial gradients, such as d(Bz)/dx, which may be an intuitive measurement for interpreting images of the magnetic fields of the heart.

Referring now to FIGS. 1a-1d, various magnet arrangements for gradiometers are shown. The majority of magnetic sources (including biomagnetic sources) produce magnetic fields that decay with increasing distance from the source as function of $1/d^3$. These are spatial magnetic gradients. First order gradiometers directly measure the gradient of the magnetic field and have reduced sensitivity to noise from magnetic intensity. Disclosed herein are second (and higher) order gradiometers which have reduced sensitivity to both first order gradients and intensities. The immunity to such fields will significantly decrease sensitivity to magnetic interference and noise. Due to the small size of the sensing platforms disclosed, the disclosed technology is able to get much closer to a sample, where second order gradients are at their maximum. These devices will similarly feel a force on a single axis directly proportional to the magnitude of the second order, or higher order, gradient magnetic field.

FIG. 1a shows a simple magnet 102, which would feel a force proportional to the first order gradient of a magnetic field. FIG. 1b shows a structure 105 with two magnets 104, 106 in a "back-to-back" configuration, and with like poles adjacent to (and facing in opposite directions) one another. The structure 105 would feel a force proportional to a second order gradient of a magnetic field. FIG. 1c shows a structure 109 with a combination of three magnets 108, 110, 112, where the central magnet 110 has like poles adjacent the outer magnets 108, 112 (with adjacent magnetic poles facing in opposite directions). Using the system 109 of FIG. 1c, the 3rd order gradient of a magnetic field can be measured directly. Force measurements can be taken in accordance with the following:

$$F_{1M} = M \cdot \frac{dB}{dx} \tag{1}$$

$$F_{2M} = \left(M \cdot \frac{dB}{dx_1} - M \cdot \frac{dB}{dx_2}\right) \propto M \cdot \frac{d^2B}{dx^2} \tag{2}$$

$$F_{3M} = \left(M \cdot \frac{d^2B}{dx_1^2} - M \cdot \frac{d^2B}{dx_2^2}\right) \propto M \cdot \frac{d^3B}{dx^3} \tag{3}$$

In Eqns. 1-3, F is a force on the structure, M is the moment of a single magnet (all magnets 102, 104, 106, 108, 110, 112 are identical), B is the magnetic intensity, and x is the position axis common to the magnet dipoles.

FIG. 1d shows a system 120 which produces great sensitivity to magnetic field intensities. A single magnet 116 will also experience a torque from magnetic field intensities. Here, a magnet 116 is embedded in a plate 114 which will produce rotation of the plate 114 around a central axis 118 upon feeling torque. A sphere 122 can be employed to measure this torque by measuring the voltage between the plate 114 and sphere 122. At far separations (>1 micron), the voltage will largely be proportional to electrostatic forces, scaling as $1/d^2$.

Figure 2A:
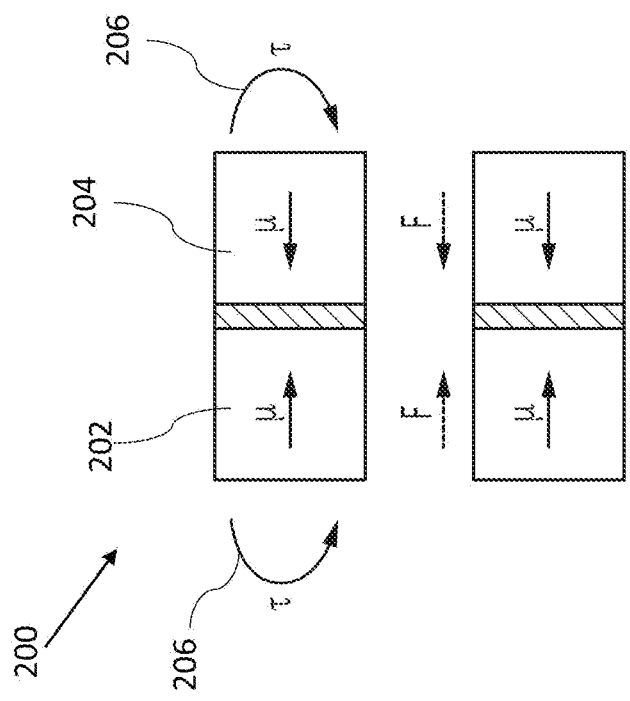
FIG. 2a is a diagram of forces on an assembly of magnets configured in accordance with the subject technology.

Referring now to FIG. 2a, a diagram 200 shows forces on back-to-back magnets 202, 204 (i.e. with like poles positioned adjacent to one another). FIG. 2a is illustrative of another benefit of a second order gradiometer design. By rigidly coupling two back-to-back magnets 202, 204 together, we can expect cancelation of torsional forces 206. For the first order gradiometer we use anisotropic design of microscale forces to minimize the effect of torsion. For a higher order gradiometer design, further attenuation of torsional forces will be enhanced by the structure. The equations 4-5 below demonstrate this, where T is a torsional force, M is the magnetic moment (all magnets are identical), B is the magnetic field intensity, and θ is the degrees of misalignment between the magnetic moment vectors and the magnetic field vector.

$$T_{1M} = M \times B = MB \sin \theta \tag{4}$$

$$T_{2M} = (MB \sin \theta + MB \sin (\theta - 180)) = MB(\sin \theta + \sin (\theta - 180)) = 0 \tag{5}$$

In equation 4, one may note that if θ=0 (the magnet moment vector is aligned with the magnetic field vector), then the torque is zero. However, in the equation for two back to back magnets, this is always zero, independent of θ.

Referring now to FIG. 2b, a system 210 is shown which illustrates a practical device for the sensitive measurement of second order gradient magnetic fields as disclosed herein. The system 210 includes two back-to-back magnets 212, 214 mechanically coupled together (e.g. attached or rigidly connected) at like poles. A microassembly 216 allows the attached magnets 212, 214 to move in either direction along a polarization axis 222 of the magnets 212, 214. A proof mass is included for reference, and the system 210 is connected to a sensing system 220, which can be a MEMS force transducer or other system designed to measure force. It should be understood that while two magnets 212, 214 are shown in the system 210 of FIG. 2b, other the other arrangements of magnets shown herein could also be employed as part of the system 210 instead of the magnets 212, 214.

Generally, sensors make gradiometric measurements via the subtraction of 2 sensors, separated by some distance along the axis of measurement. For many applications, this is a disadvantage because the sensors are spaced so far apart that the further away sensor barely sees any field, and may see only background. Furthermore, the subtraction of two signals can add noise and complexity to a measurement. However, there are disadvantages to being too small as well. The signal has higher order gradients too and so a gradient measurement is not a perfect representation of the signal. In accordance with the teachings herein, optimum magnet design can help amplify the sensitivity. A recent paper in Nature scientific reports used a research laboratory setup with an atomic magnetometer to measure the profile of a cardiac magnetic field extending away from the heart. This data is relied on herein in further calculations and design optimization routines for more credible accuracy.

Figure 3A:
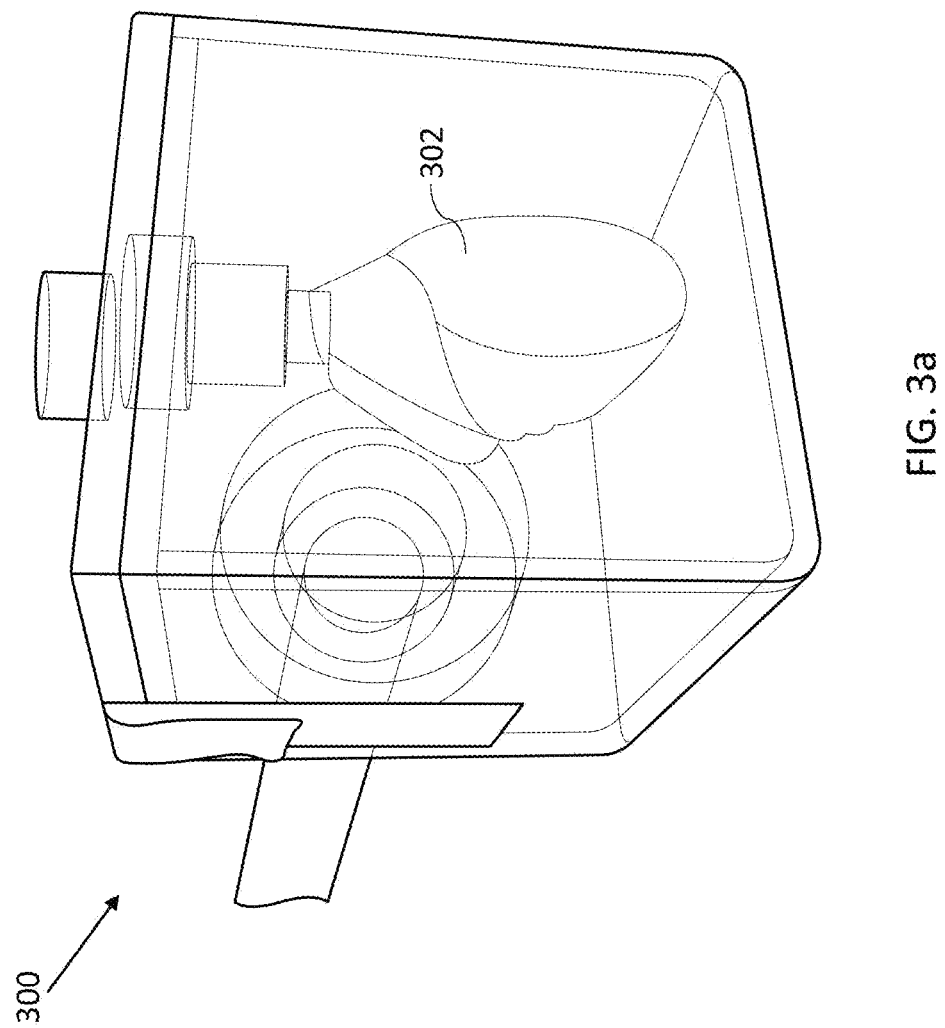
FIG. 3a is a guinea pig heart in Langendorf preparation as part of an experimental setup for measuring forces and gradients.
Figure 3C:
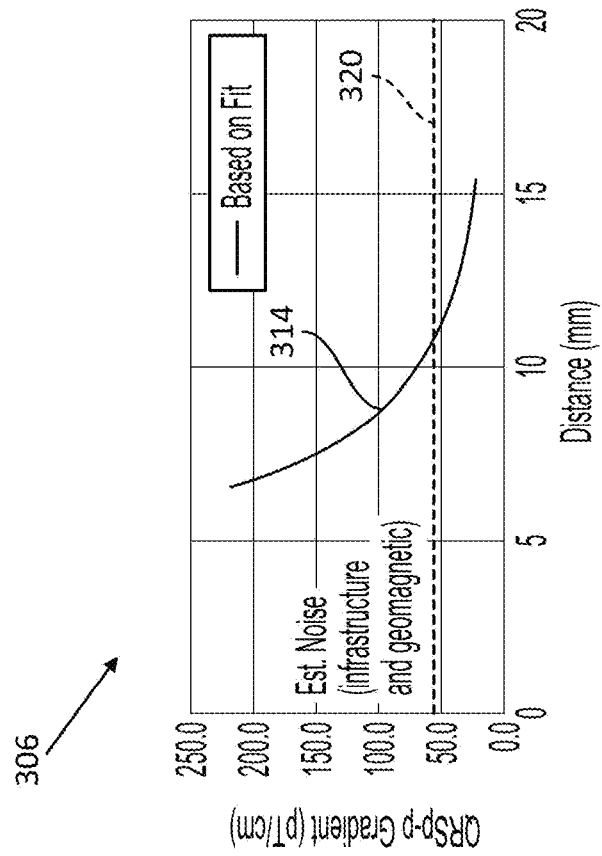
Figure 3B:
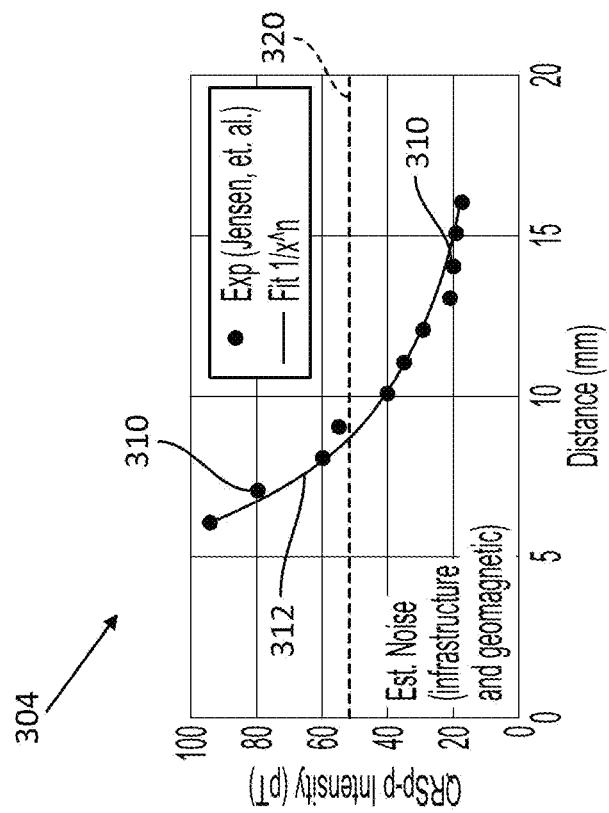
Figure 3D:
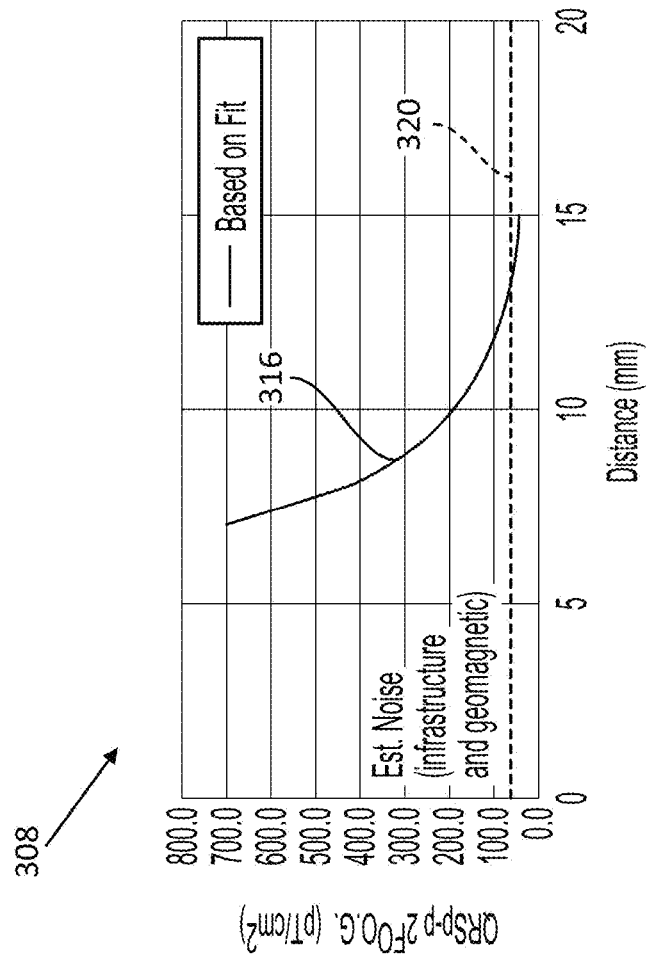

Referring now to FIG. 3a, the heart of a guinea pig 302 is shown in a Langendorf preparation, an experimental setup that simulates a normal physiological environment. FIGS. 3b-3d are graphs 304, 306, 308 showing measurements presented in the journal article, with data points shown in graph 304 as dots 310. The peak-to-peak of a magnetic intensity signal from the heart is measured. Borrowing language from electrocardiogram measurements, this would be a measurement of the QRS complex. Therefore, the y axis is labeled QRSpp, and the units are picoTesla. At 6 mm away from the heart, about 100 pT is measured. As the sensor is moved further away, the signal diminishes. The fit to this profile is described as following the form of equations 6-7 below, with other publications having found similar profiles.

$$B_{cardiac} \propto \frac{1}{x^{1.7}} \tag{6}$$

$$B_{magnet} \propto \frac{1}{x^3} \tag{7}$$

This relationship is noted herein as the profile of the magnetic field extending from a cube permanent magnet will closely follow a cubic profile. Therefore, the cardiac signal will have smaller gradients than a permanent magnet, but the tradeoffs still provide opportunity. This prior work provides a foundation for understanding the systems described in the following discussions. Finally, the reason for the difference in field profile is directly due to the geometry of the heart, including contributions from ionic currents throughout.

Referring again to FIG. 3b, the graph line 312 is fit to the data points 310, with an exponent of 1.7. With this field profile we can compute the second order spatial gradient along this profile, yielding the curve 314 shown in FIG. 3c. Here, we note that a 200 pT/cm field is anticipated at about 7 mm away from the heart, and the signal falls off a bit more quickly. Furthermore, we compute the second order gradient given by graph line 316 in FIG. 3d by taking the spatial derivative again. Here, we anticipate a field of 700 pT/cm² at about 8 mm from the heart. And again, the signal 316 falls off more quickly as you move away from the heart.

Of note as well is the estimated magnitude of magnetic noise from electromagnetic equipment in hospitals (refrigerators, MRI machines, etc.). In most areas of a hospital, there is expected to be about 50 pT of noise, threatening to obscure a biomagnetic measurement. This is precisely the reason why today's biomagnetic technology requires magnetic shielding. Such shielding is sometimes implemented as a specialized facility, where thick steel or Nickel alloys are integrated into the walls of a room to attenuate magnetic interference. In other cases, a large cylinder with a bore to fit an entire human being and sensing system is purchased for a room.

These are the state of the art for biomagnetic imaging. In each graph 304, 306, 308, noise level is denoted by graph line 320. In graph 306 of FIG. 3c, we note that the noise levels 320 are smaller, relative to the signal 314. This is even further enhanced in graph 308 of FIG. 3d. The signal to noise ratios at closest proximity are 2, 4, and 14 respectively, across the three graphs 304, 306, and 308. One can now clearly see the advantage of measuring gradient fields when close to the source of interest and farther away from sources of interference. Using the published cardiac data from a biomagnetic sensor, we proceed with our optimization discussion.

Figure 4:
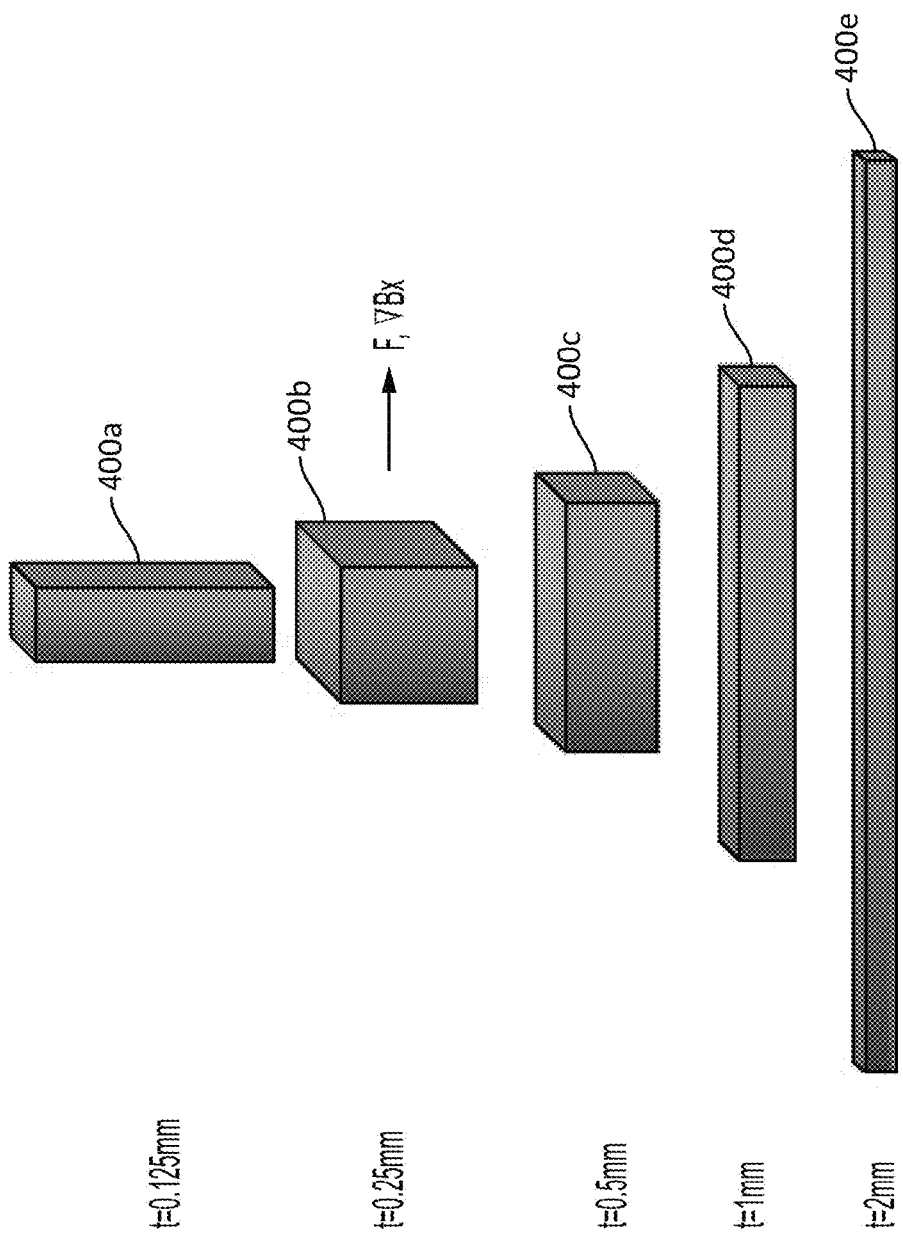
FIG. 4 is a series of magnets with varying thickness for use as part of the systems disclosed herein.

Referring now to FIG. 4, images magnets 400a, 400b, 400c, 400d, 400e (generally 400) with varying thickness along their dipole axis, while conserving volume. Therefore, the magnetic moment is also constant. This changes the interaction of the magnet with the field because a larger spatial region of the field profile is interacting with the magnet. In FIG. 4, we illustrate the design of such magnets, where the nominal design (magnet 400b) is a cube of thickness 0.25 mm. The other thicknesses are as follows: magnet 400a is a thickness of 0.125 mm; magnet 400c is a thickness of 0.5 mm; magnet 400d is a thickness of 1 mm; and magnet 400e is a thickness of 2 mm. All dimensions shown are manufacturable. The magnets 400 can be used within the gradiometers described herein.

Figure 5:
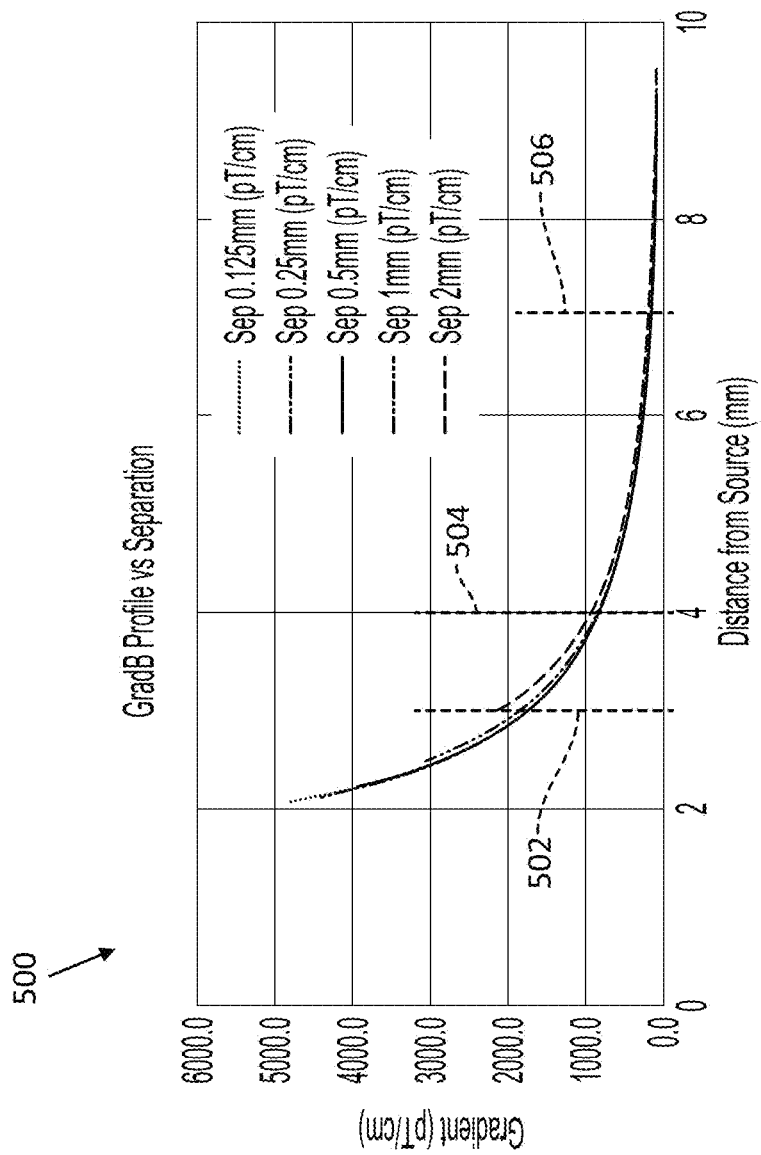
FIGS. 5, 6, and 7 are graphs of the data obtained from a gradiometer utilizing the magnet geometries of FIG. 4.
Figure 6:
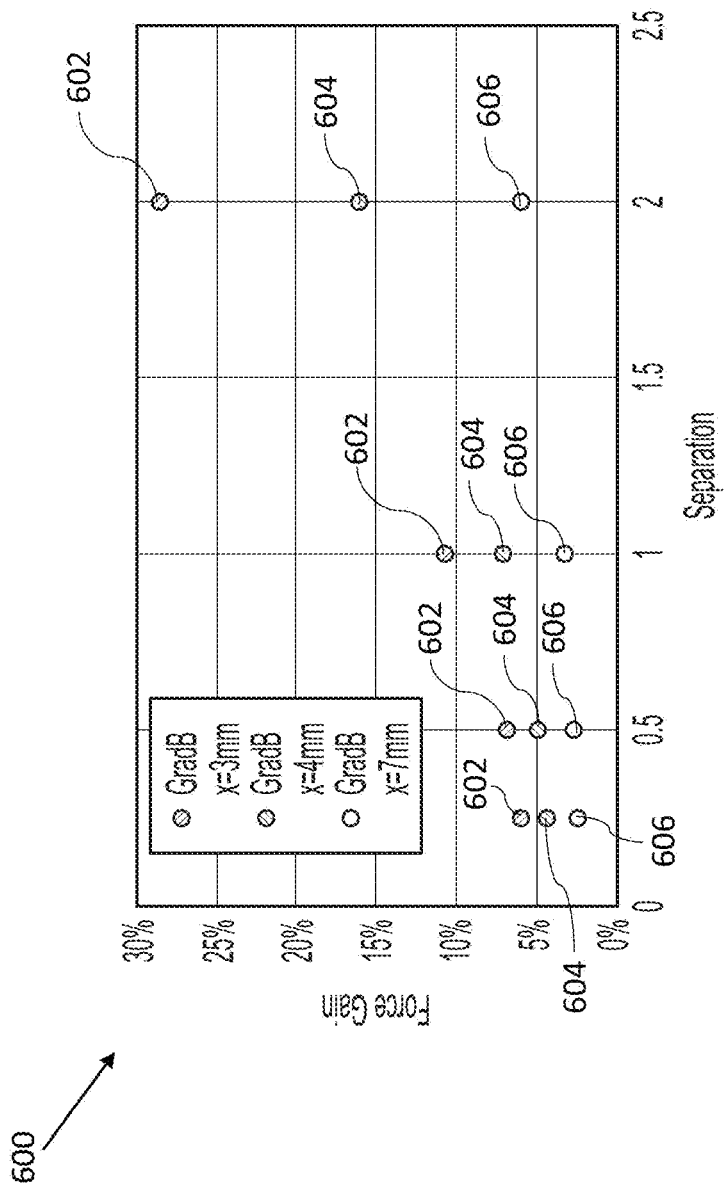

Referring now to FIG. 5, a graph 500 represents an extrapolated fit from the cardiac data up to 2 mm from the source. This is reasonable as the magnetic sensor chip used in the systems disclosed herein, including the ASIC, MEMS, and magnet array, is on a 2 mm by 2 mm die, and thus has a distance of 1 mm from the edge to the center of the magnet array. At 2 mm, we now observe estimated field magnitudes near 5000 pT/cm, or 5 nT/cm. Now, we evaluate the gradient magnetic field that would be observed by each of the magnet geometries from FIG. 4. On this plot 500, it appears that the fields are somewhat similar. However, there is marginal gain that is calculated and plotted in graph 600 of FIG. 6. In FIG. 6, the x-axis is the thickness of the magnet (here labeled as separation). The y-axis is the percentage gain in force (or gradient magnetic field) experienced by the magnet. The different sets of data points 602, 604, 606 are represented by dashed lines 502, 504, 506, respectively, in FIG. 5 (which are at 3 mm, 4 mm, and 7 mm from the source, respectively). Notably, a magnet with a 2 mm length will experience up to 30% gain in force when positioned 3 mm from the source. This translates, in the systems disclosed herein, to a device using the same materials in different geometries, which has enhanced sensitivity to gradient magnetic fields.

Figure 7:
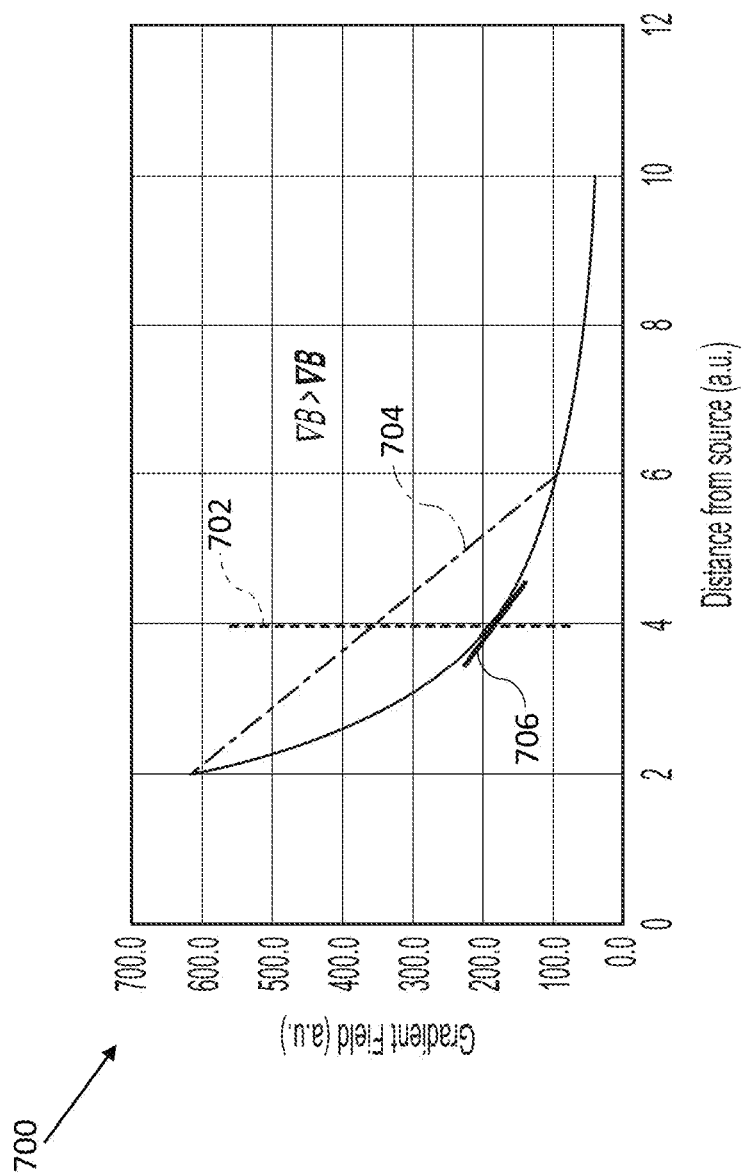

Referring now to FIG. 7, a graph 700 illustrates the reason for this effect. The dashed line 702 represents the center of the device, placed some distance from the source. Graph line 704 represents the gradient magnetic field observed by a 2 mm long magnet and graph line 706 represents a gradient field experienced by a 0.5 mm magnet. Here, we can observe by eye that the 2 mm magnet would experience a greater signal. It is noteworthy that there is a sweet spot for such a measurement. One could make the magnet arbitrarily long and continue to increase the gain, but the greatest gain occurs close to the source. In order to get close to the source, one needs a smaller magnet and a smaller device.

Figure 8:
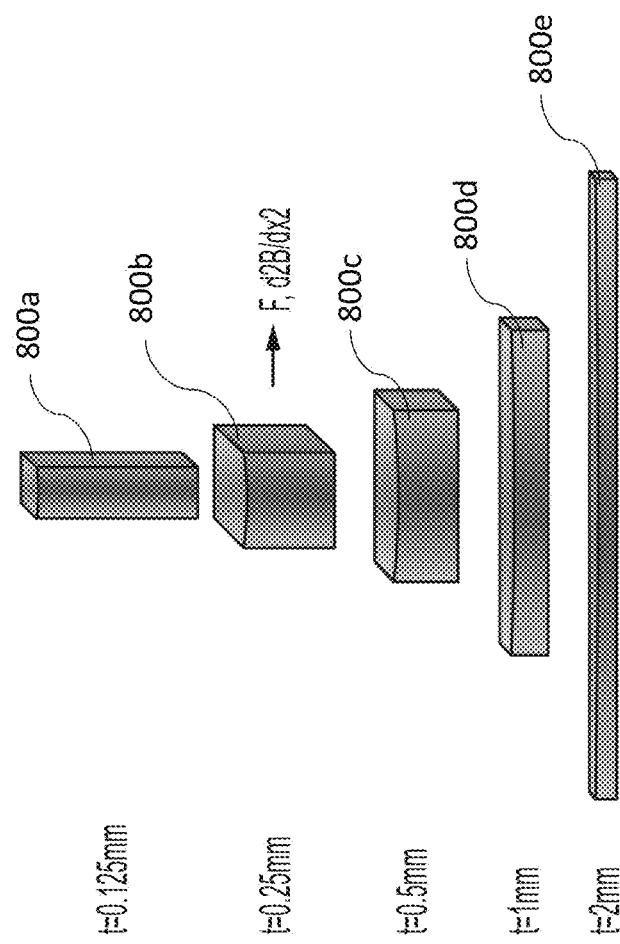
FIG. 8 is a series of magnet pairs with varying thickness for use as part of the systems disclosed herein.

Next, we can extrapolate our methods from optimizing the first order gradient to an optimization of a second order gradient sensor. Referring now to FIG. 8, a similar arrangement to FIG. 4 is shown, with magnets of varying thickness. The difference is that each array 800a, 800b, 800c, 800d, 800e of FIG. 8 is a combination of two magnets positioned back-to-back (e.g. with like poles adjacent). Recall that the force on a structure here is proportional to the second order spatial gradient of the magnetic field along the direction of the common dipole axis of the magnets.

Figure 9:
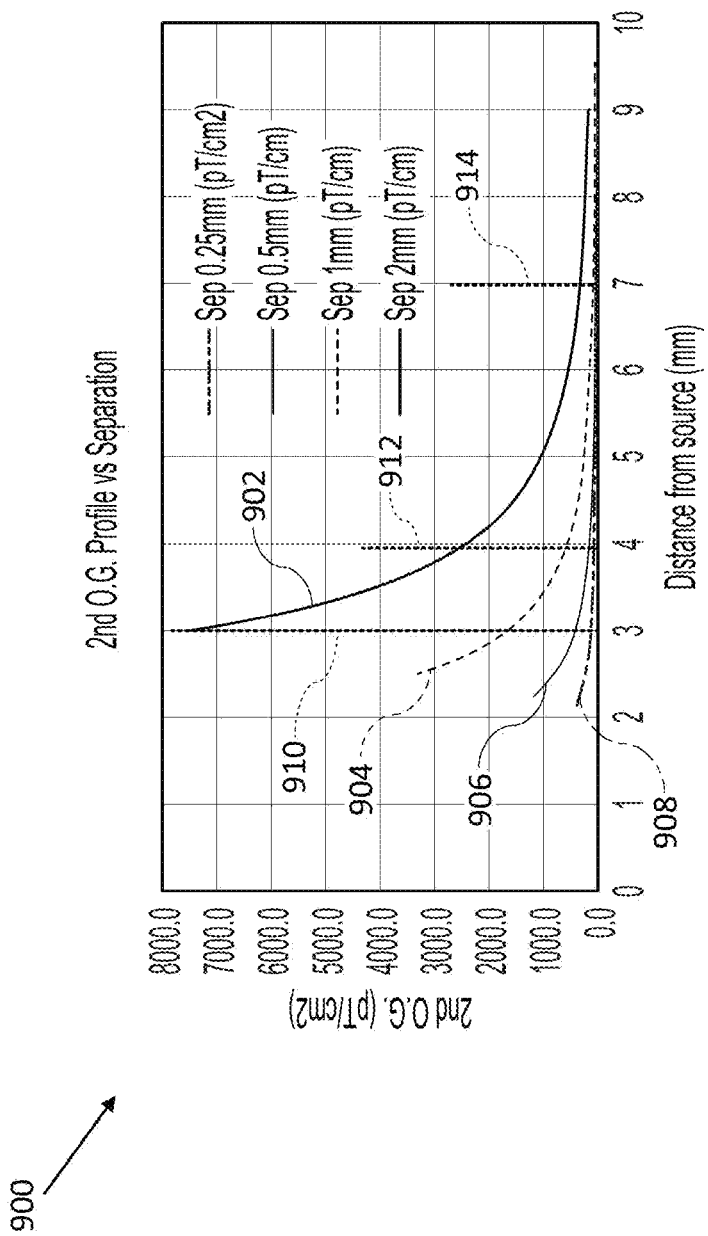
FIGS. 9-10 are graphs of the data obtained from a gradiometer utilizing the magnet pair geometries of FIG. 8.
Figure 10:
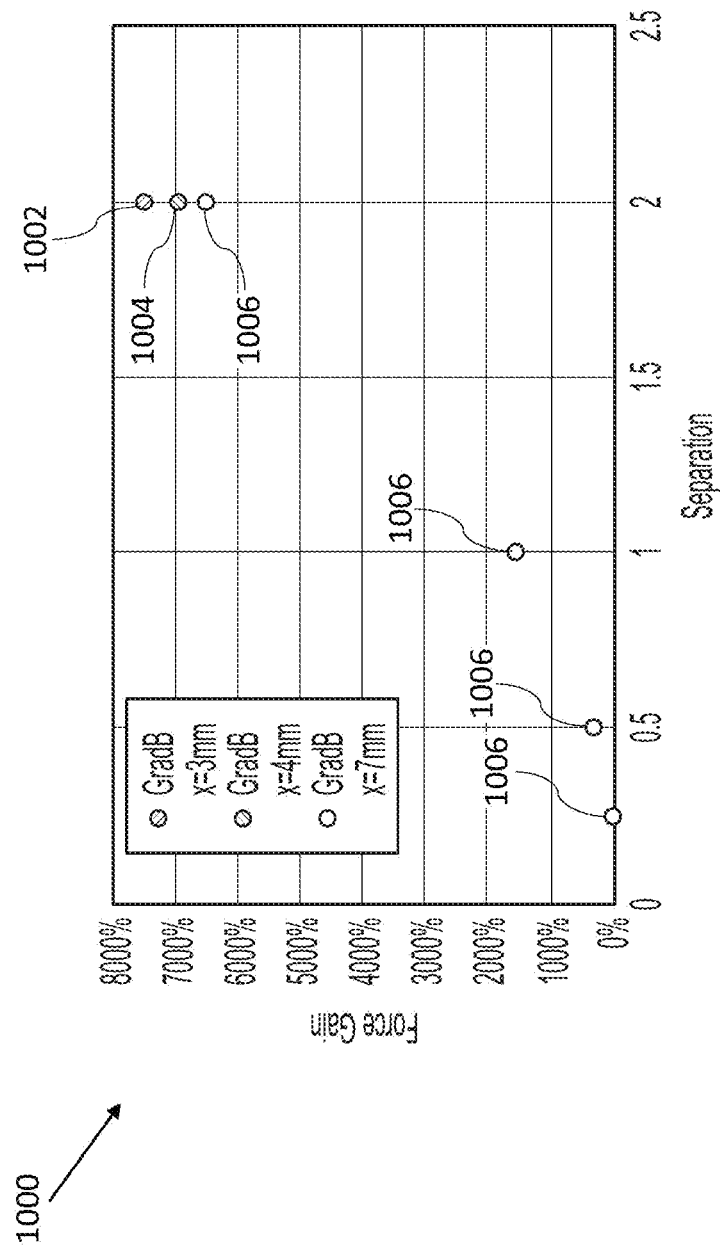

Referring now to FIG. 9 a graph 900 similar to graph 500 of FIG. 5 is shown. To create graph 900, we computed second order gradient field up to 2 mm from the source, calculated from the published cardiac data. Each of the profiles represents a different magnet array thickness illustrated in FIG. 8 as follows: graph line 902 corresponds with a thickness of 2 mm; graph line 904 corresponds with a thickness of 1 mm; graph line 906 corresponds with a thickness of 0.5 mm; and graph line 908 corresponds with a thickness of 0.25 mm. This time, the term separation may make more sense since this array will be made from two back-to-back magnets. Notably, the profiles are much more visibly separated in graph 900, as compared to graph 500. This indicates that this configuration is more sensitive to the thickness variable, where greater thicknesses yield larger field measurements. This is an extrapolation of the concept illustrated in graph 700 of FIG. 7, as the spatial derivative of the plot was calculated a second time. Three slices (dotted lines 910, 912, 914) from graph 900 are compared in graph 1000 of FIG. 10, with slice 910 corresponding to graph points 1002, slice 912 corresponding to graph points 1004, and slice 914 corresponding to graph points 1006. We observe that thickness of the assembly (separation between the magnets) has an exponential relationship with the sensitivity, illustrated here as a force gain percentage. Notably, an array with a 2 mm separation between the magnets would have a 7000% gain in the force. This provides an effective guide for a MEMS second order gradiometer.

Even with this design understood, fabrication of the array presents serious design challenges. Therefore we now discuss custom procedures for fabrication of a magnetic array and corresponding system in accordance with the subject technology.

Firstly, we should note the obvious: magnets in a back-to-back position will impose a strong force on each other, and that force will increase exponentially as you bring them closer together. When the dipoles are perfectly aligned, the force should only be on that axis and should be easy to counter. However, small degrees of misalignment will create large off-axis forces. Secondly, the magnets are small (0.25 to 0.5 mm) and so manipulation of them is challenging.

We first considered fabricating a mold to hold each of the magnets, using, for example, miniaturized equipment, including a small drill press, end mill, PCB cutting saw, and other common fabrication tools. However, the magnets are cubes and it is challenging, or impossible, to make a perfect 90 degree cut in a mold, since typically circular motion of a drill is used. The smallest drill sizes that we are commercially available are around 0.1 mm. This limits our ability to fabricate a hole in a part that could properly constrain the magnet.

Next, we considered 3D printing, where one can obtain lateral resolutions of about 25 microns using direct laser writing in a commercial foundry. However, these materials are not transparent, and so the ability to align the magnet dipoles under a microscope would be challenging. We considered precision lithography approaches, such as spinning photoresist and using a mask aligner to precisely bring the two magnets together, but such a process may be long and cumbersome. This might be considered for higher throughput fabrication of the arrays however.

After considering the constraints, we developed a fabrication process using microfabrication equipment consisting of articulated vacuum micropipettes, a probe station with a microscope, and micromanipulators with 7 degrees of freedom. This process is shown in FIGS. 11a-11f and described in detail below.

Figure 11C:
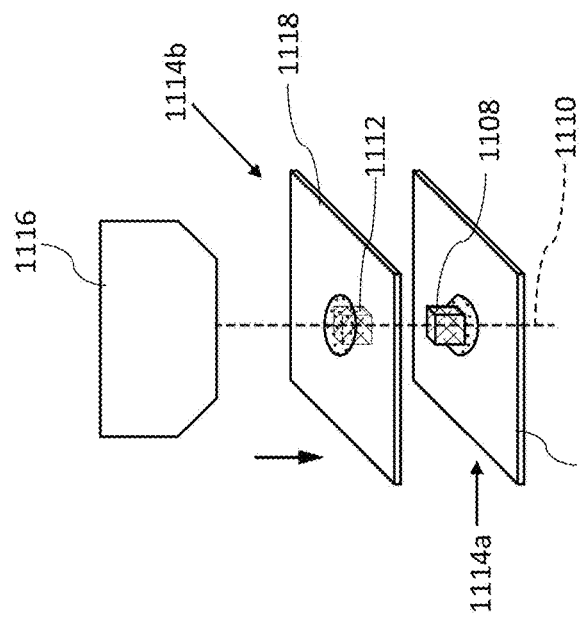
FIGS. 11a, 11b, 11c, 11d, 11e, and 11f are exemplary steps of a manufacturing process for assembling a magnet assembly in accordance with the subject technology.
Figure 11B:
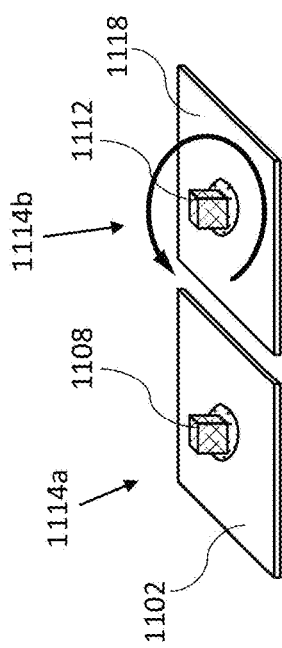
Figure 11A:
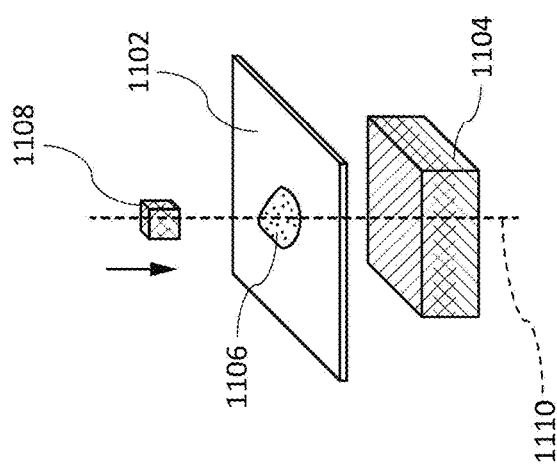
Figure 11F:
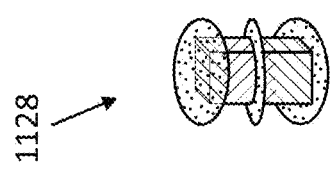

To that end, referring now to FIGS. 11a11f, exemplary steps of a manufacturing process for a magnet array in accordance with the subject technology are shown. The process begins in FIG. 11a, where a 70 um thin clear glass coverslip 1102 is suspended. Notably, the coverslip 1102 could be replaced by another substrate in other cases. A large, external magnet 1104 is placed below the coverslip 1102. A microscale drop of UV curable epoxy 1106 is dotted on the coverslip 1102 using a probe. A micromagnet 1108 is introduced from above. The micromagnet 1108 is manipulated by a vacuum pick-and-place micropipette. This step could be completed with tweezers (or other instruments) as well, since the external magnet 1104 below will guide and center the micromagnet 1108. The external magnet's 1104 dipole orientation is known and so we know the external magnet 1108 will align with it on the coverslip 1102. The UV curable epoxy 1106 is cured with 30 s of UV exposure and the coverslip 1102 with micromagnet 1108 is removed by moving up along the dipole axis 1110 to minimize transverse forces.

This step is then repeated with a second magnet 1112 (which can include a similar magnet and coverslip of similar sizes to the first magnet 1108 and coverslip 1102), as shown in FIG. 11b. One of the assemblies 1114b is then rotated 180 degrees. The bottom assembly 1114*a* is fixed to a flat, stationary surface. A microscale drop of UV glue (1124 of FIG. 11*d*) is added to the bottom magnet 1108. The top assembly 1114*b* is fixed to a flat bottom piece on a micromanipulator.

As shown in FIG. 11*c*, a brightfield microscope 1116 is used to focus on the bottom micromagnet 1108. The top micromagnet 1112 is kept about 1 cm higher than the bottom magnet 1108 as it is translated to align the dipole axis 1110. Since the glass coverslips 1102, 1118 are transparent, we can observe both micromagnets 1108, 1112 through the microscope 1116. The microscope 1116 objective is translated up and down (e.g. along the axis 1110) to improve alignment of the magnet dipoles. The top micromagnet 1112 is slowly lowered toward the bottom micromagnet 1108. The magnets 1108, 1112 are reflective, and so any small change in the reflected light indicates contact between the magnets 1108, 1112 as they are lowered, yielding the assembly 1122 of FIG. 11*d*. It is important the glass coverslips 1102, 1118 are much wider than the magnets 1108, 1112, as this makes the counteraction of torsional forces between the magnets 1108, 1112 easier. The magnets 1108, 1112, are held back-to-back as the UV epoxy 1124 is cured with 30 s of UV radiation. The assembly may be baked overnight at 60 C to ensure a full cure of the epoxy.

Figure 11E:
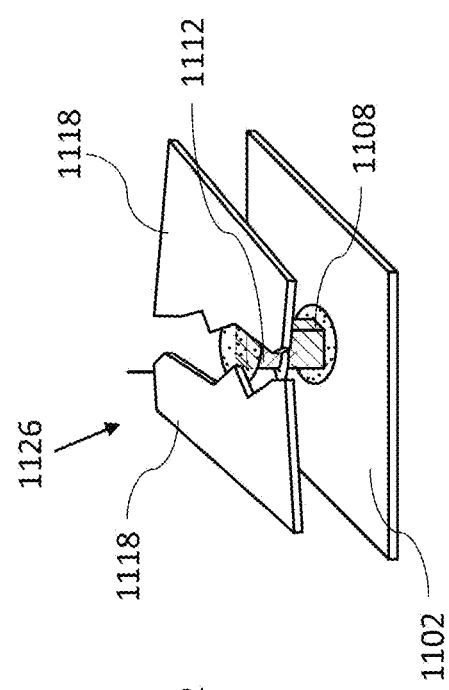
Figure 11D:
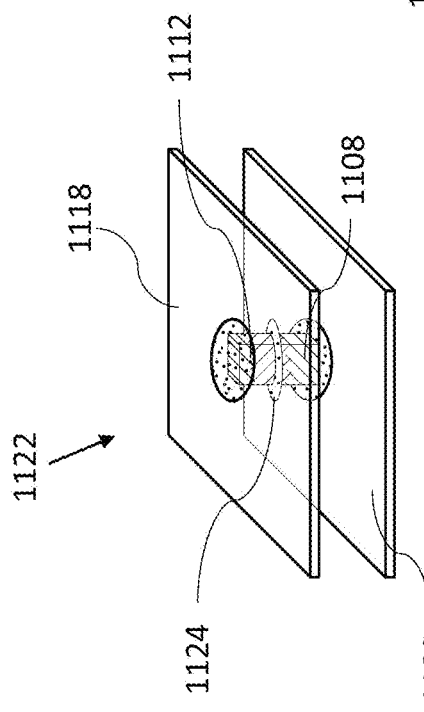

Referring now to FIG. 11*e*, a diamond tipped pen (not shown distinctly) is then introduced directly on top of the magnet 1112 face, and pressed. The glass coverslip 1118 will cleanly crack without disturbing the magnets 1108, 1112. The assembly 1126 is then flipped 180 degrees and this is repeated on the bottom glass coverslip 1102. The final assembly 1128 is shown in FIG. 11*f*. This assembly 1128 (i.e. magnet array) can then be manipulated via the vacuum pick-and-place micropipette and assembled on other structures for characterization. For example, the assembly 1128 can be used as part of a gradiometer as disclosed herein. This can build on existing techniques for fabrication on post-release MEMS accelerometers used to detect ultralow forces on the magnets.

We utilize an elastomer and microscope system to characterize forces on the micromagnet arrays (e.g. assembly 1128). A polydimethylsiloxane micropost is fabricate by pouring the mixture into a 3D printed mold and baking overnight. The post dimensions are approximately 500×500 um in cross section and 800 microns tall. Microdroplets of UV epoxy are added to the top of the posts and the magnet assembly 1128 is fixed at the top of the post. An external electromagnetic coil system is introduced on either side of the assembly 1128 to impose magnetic fields. The microscope will measure deflections of the post via image processing, and forces will be inferred. Therefore the gradiometer uses a combination of the magnet array of the assembly 1128, with the change in gradient being measured by the microscope acting as the sensing system.

Figure 12B:
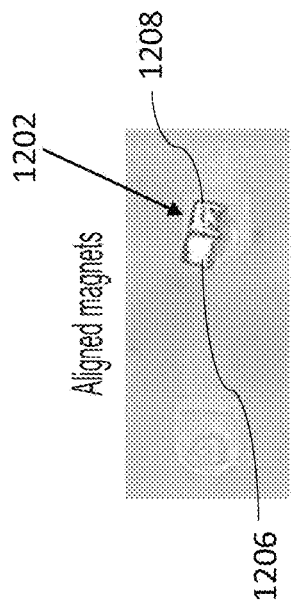
FIGS. 12a, 12b are overhead views of a magnet assembly in accordance with the subject technology.
Figure 12A:
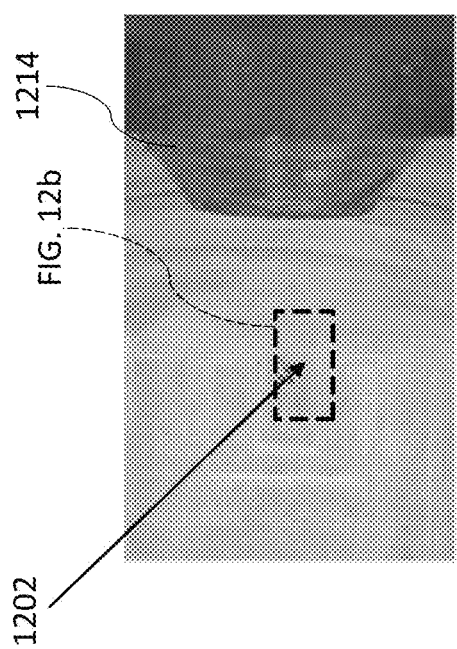

Referring now to FIGS. 12*a*-12*d*, two sets of magnet assemblies 1202, 1204 are shown. In FIGS. 12*a*-12*b*, the magnet assembly 1202 includes two micromagnets 1206, 1208 with aligned dipoles, simply holding themselves together by magnetic forces. In FIGS. 12*c*-12*d*, two magnets 1210, 1212 are positioned in a back-to-back configuration, fabricated by the procedure shown in FIGS. 11*a*-11*f*. FIGS. 12*a* and 12*c* include part of the coil 1214 for scale. Only the iron core of the coil 1214 is visible in the images, where the coil diameter is approximately 3 times larger (approximately 2.5 cm diameter and 4 cm long). A DC current will be controlled in the coil(s) 1214 to impose a magnetic force.

For simplicity, we will refer to the aligned-pole magnets as "NS" magnets and to the back-to-back magnets as "NN" herein.

Figure 13:
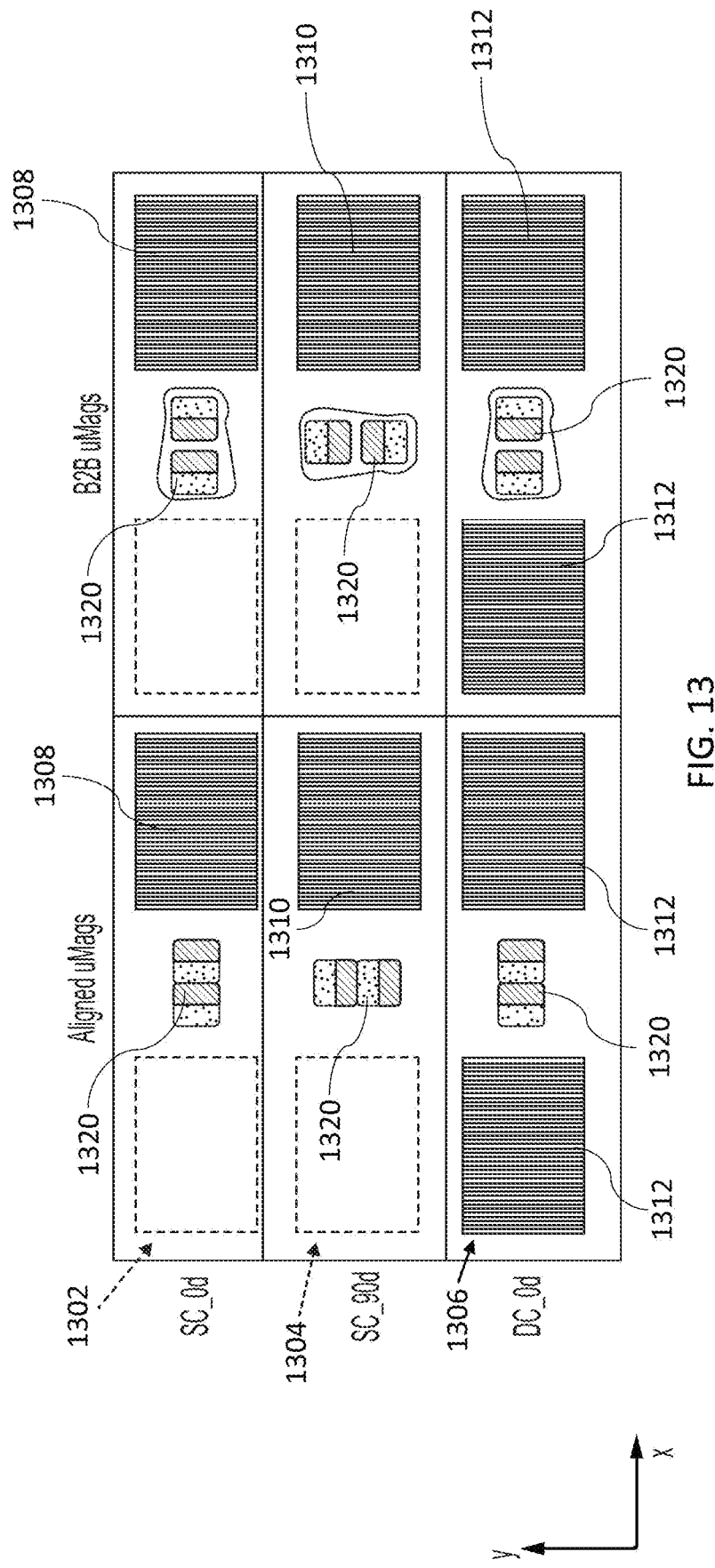
FIG. 13 is a schematic diagram of various configurations of magnet assemblies in accordance with the subject technology.

Referring now to FIG. 13, various configurations of magnet assemblies 1302, 1304, 1306. Each assembly 1302, 1304, 1306 depicts one arrangement with a magnet pair 1320 in an "NS" arrangement and a second arrangement with a magnet pair 1320 in an "NN" arrangement (notably, the NS and NN arrangements would be deployed independently, not as part of the same gradiometers). The first assembly 1302, SC_0d, is a single coil 1308 aligned at 0 degrees with the magnet dipole axis. The spatial magnetic field profile from a single coil contains gradients of $0^{th}$ (intensity), first, and second orders. The alignment of the magnets 1320 is expected to either pull or push the assembly 1302. The second assembly 1304, SC_90d, is a single coil 1310 at 90 degrees relative to the dipole axis. The extreme misalignment is expected to impose a torque on the magnets 1320. The third assembly 1306, DC_0d, is a dual coil 1312 system aligned at 0 degrees with the dipole axis. The coils 1312 may be wired such that they produce magnetic field in the same direction (parallel coils) or in opposite directions (anti-parallel coils). In the parallel case, the spatial magnetic field contains only magnetic field intensities and no gradients. In the anti-parallel case, the spatial magnetic field profile contains first and second order gradients and no intensities. We will only characterize the latter (anti-parallel) case since the first configuration, given by assembly 1302, already encompasses on-axis magnetic field intensities.

The experimental procedure is to sweep the current in the coils from a negative current to a positive current, recording microscope images at each current value. The current is directly proportional each of the $0^{th}$, first, and second order fields in the coils (the field profile/shape is preserved and is only scaled by the current). The images are post-processed to record deflection in X (coil axis), Y (90 degrees from coil axis in plane), and θ (degree of rotation in XY plane). Out-of-plane motion is not accounted for and is considered to be minimal for small deflections of the PDMS post. It is noteworthy that the PDMS post is very soft in all directions compared to forces we impose on the magnets, making this an appropriate characterization platform.

Figure 14A:
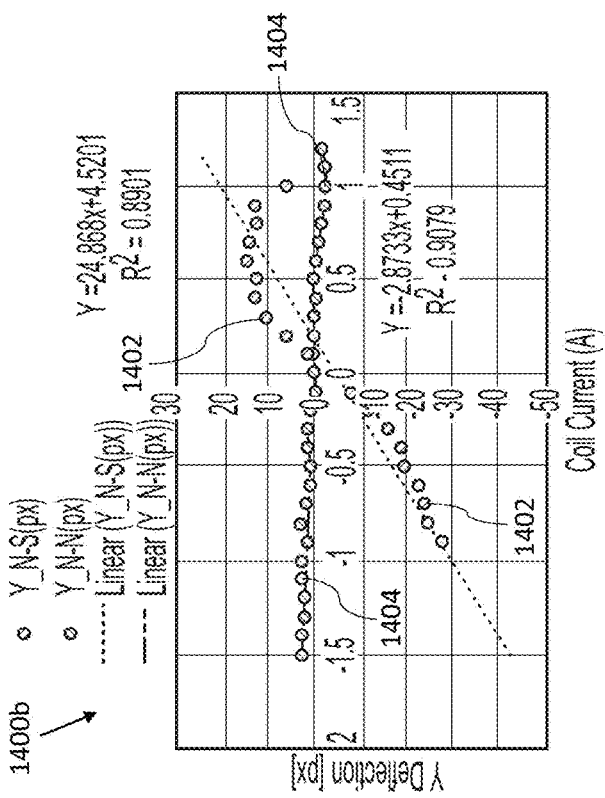
FIGS. 14a, 14b, and 14c are graphs of data obtained using one of the magnet assemblies of FIG. 13.
Figure 14B:
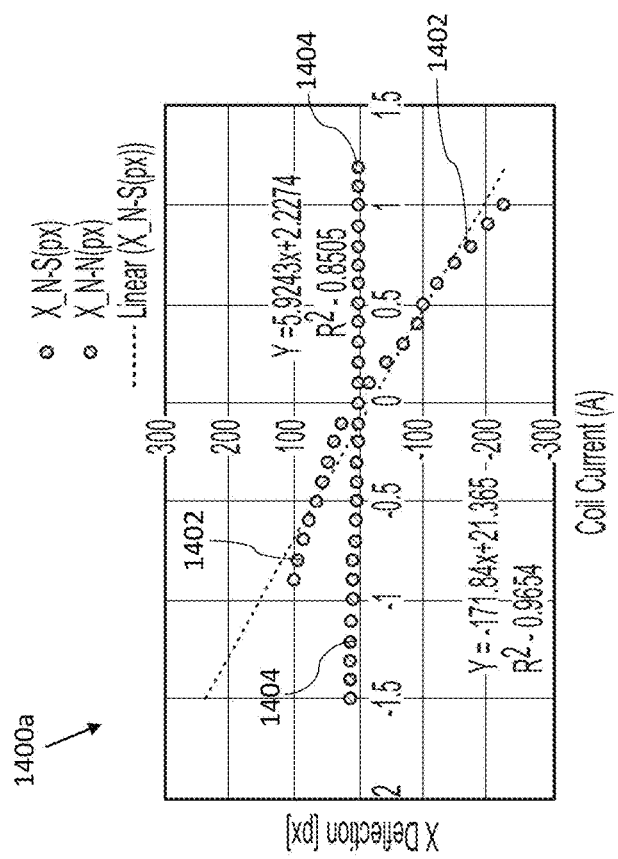
Figure 14C:
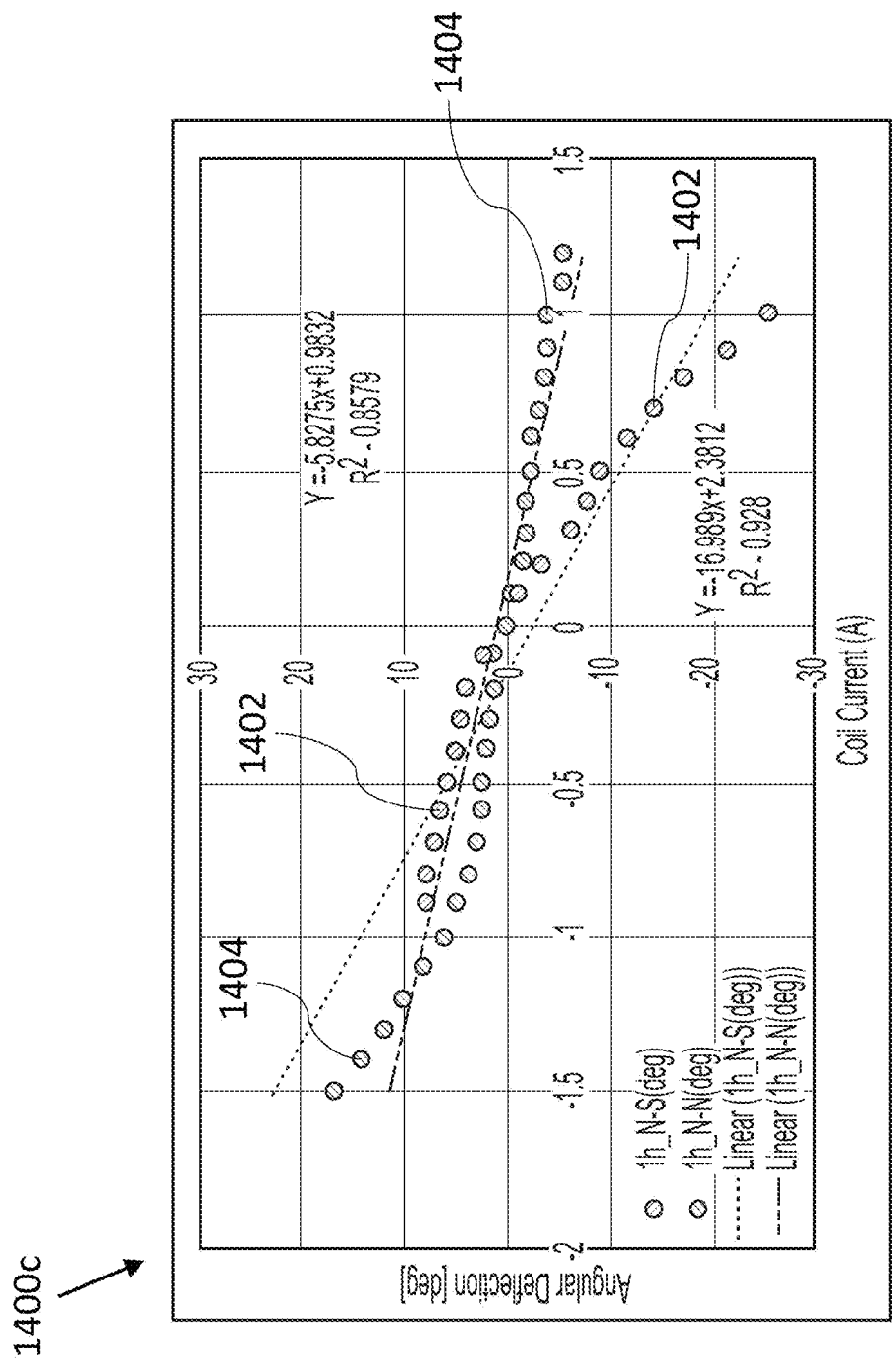

Referring now to FIGS. 14*a*-14*c*, graphs 1400*a*, 1400*b*, 1400*c* of the results for the first assembly 1302 are shown. Graph points 1402 represent the assembly 1302 when the magnets are positioned in an "NS" arrangement, while graph points 1404 represent the assembly 1302 when the magnets are positioned in an "NN" arrangement. Graph 1400*a* represents deflection along the x axis, graph 1400*b* represents deflection along the y axis, and graph 1400*c* is θ deflection. Compared to the NS assembly (e.g. points 1402), the NN assembly (points 1404) reduced the X deflection by 34x. We note that the deflections become nonlinear at larger currents, as the field profile from a single coil contains $0^{th}$, first, and second order gradients (it is nonlinear). The NN assembly reduces Y deflections by 13x, and we observe a larger nonlinear effect in the NS deflection profile, partly from the nonlinear field and partly from misalignment of the magnet fabrication. Finally, the NN magnets reduce θ deflection by about 2x compared to the NS assembly. Overall, we interpret this as decreased sensitivity to $0^{th}$ and first order gradient fields, which will improve even further with greater fabrication alignment.

It is noteworthy that is the only configuration that presents second order gradient fields on-axis with the micromagnet assemblies. The second order gradient component is small compared to the $0^{th}$ and first order gradients, especially for these electromagnets. The X deflection, supplemented by the results of FIGS. 15 and 16 described below, demonstrate that the NN configuration is selectively sensitive to forces from second order gradient magnetic fields.

Figure 15B:
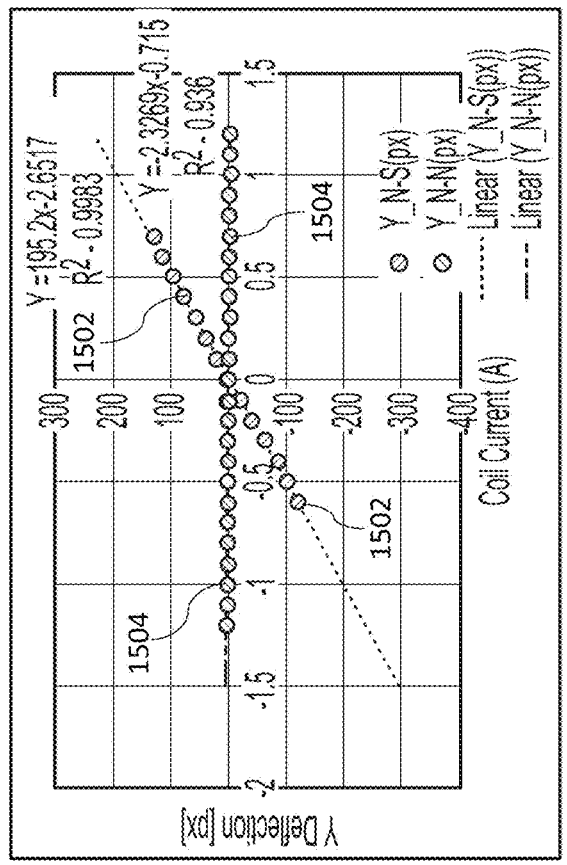
FIGS. 15a, 15b, and 15c are graphs of data obtained using another one of the magnet assemblies of FIG. 13.
Figure 15A:
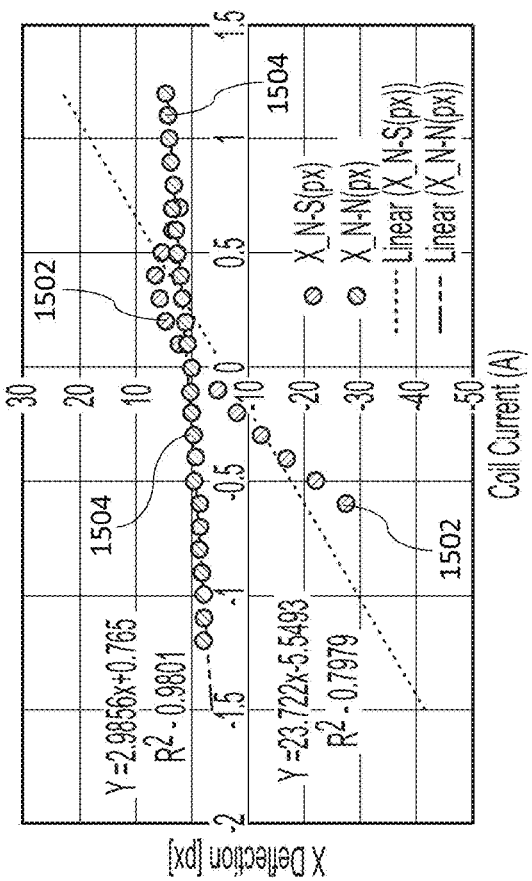
Figure 15C:
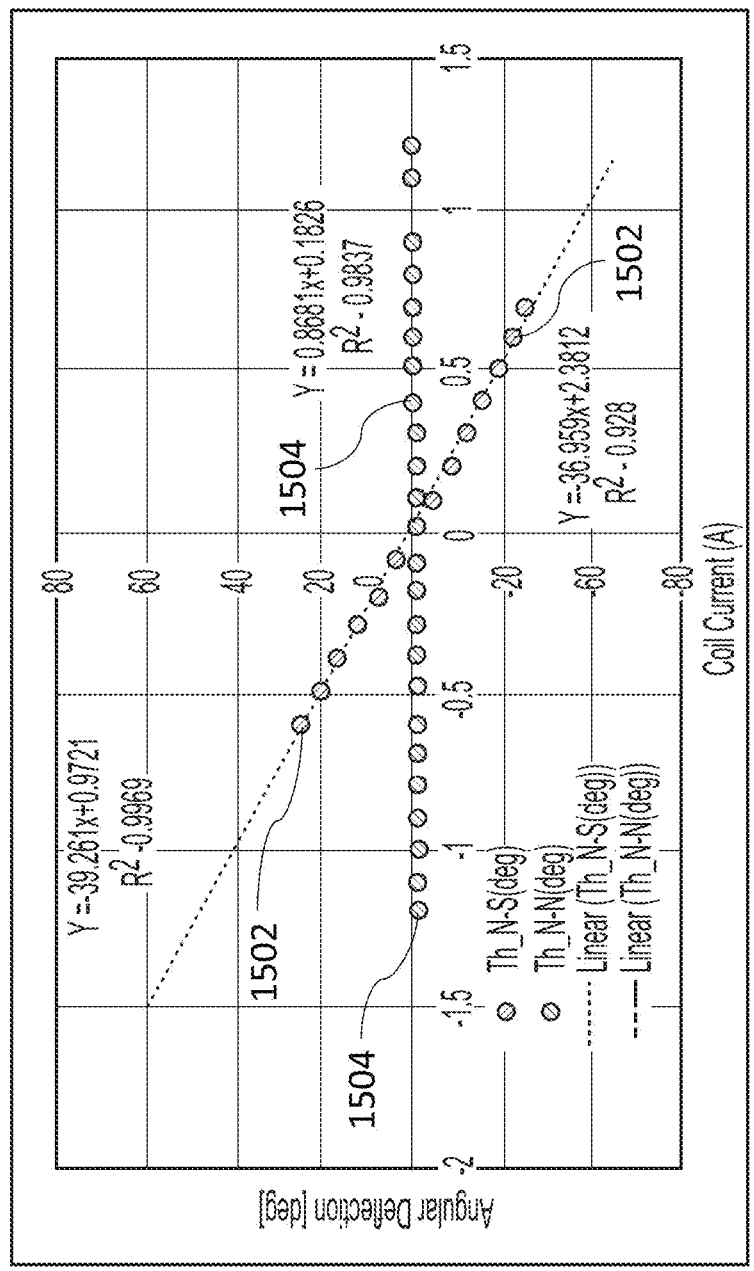

Referring now to FIGS. 15a-15c, graphs 1500a, 1500b, 1500c of the results for the second assembly 1304 are shown. Graph points 1502 represent the assembly 1304 when the magnets are positioned in an "NS" arrangement, while graph points 1504 represent the assembly 1304 when the magnets are positioned in an "NN" arrangement. Graph 1500a represents deflection along the x axis, graph 1500b represents deflection along the y axis, and graph 1500c is θ deflection. Compared to the NS assembly, the NN assembly reduced deflections in the X direction by 8x, in the Y direction by 84x, and in the θ direction by 45x. This serves as validation of the torsional equations 4-5 discussed earlier. This is a reminder that a permanent magnet, used as a sensor, is sensitive to both magnetic intensities (as a torque) and $1^{st}$ order gradients (as a force along the dipole axis). Our soft pillar platform illustrates this quite well. Our fabrication of a first order gradiometer took advantage of anisotropic mechanical structures on MEMS accelerometers to decrease sensitivity to torsional forces, but it is still a remaining source of noise. The graphs 1500a, 1500b, 1500c show that the NN assembly selectively reduces sensitivity to both $0^{th}$ and first order gradients by design.

Figures 16A, 16B:
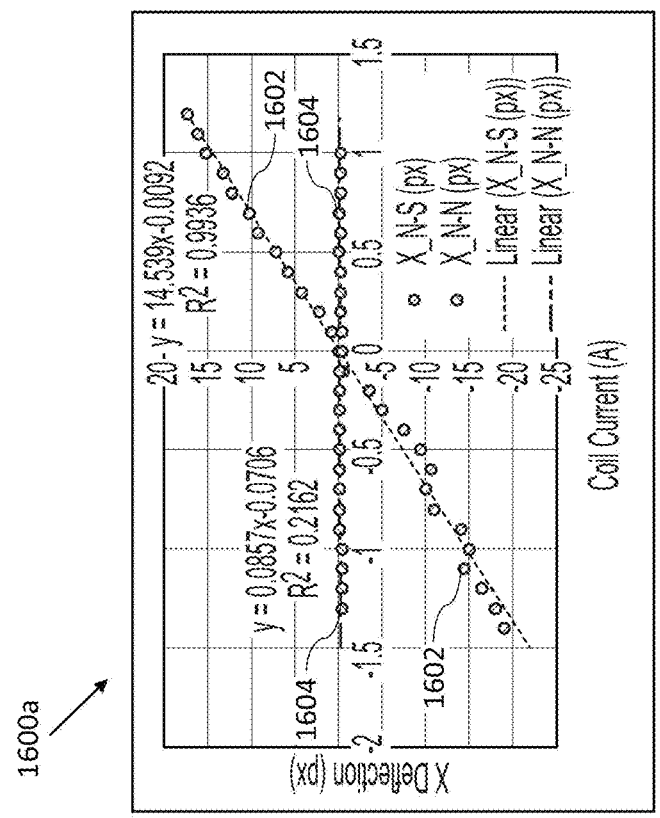
FIGS. 16a, 16b, and 16c are graphs of data obtained using yet another one of the magnet assemblies of FIG. 13.
Figure 16C:
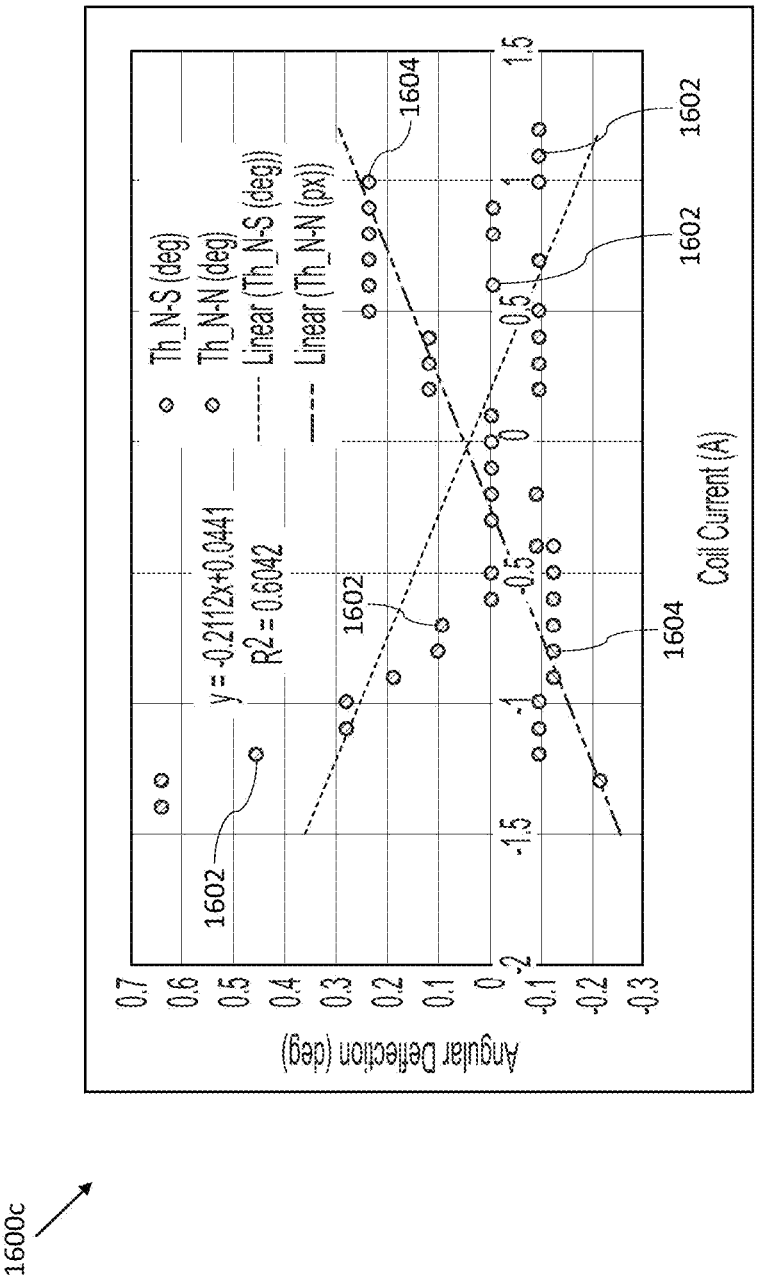

Referring now to FIGS. 16a-16c, graphs 1600a, 1600b, 1600c of the results for the third assembly 1306 with the antiparallel coils are shown. Graph points 1602 represent the assembly 1306 when the magnets are positioned in an "NS" arrangement, while graph points 1604 represent the assembly 1306 when the magnets are positioned in an "NN" arrangement. Graph 1600a represents deflection along the x axis, graph 1600b represents deflection along the y axis, and graph 1600c is θ deflection. Compared to the NS assembly, the NN assembly reduces X deflection by 175x, the Y deflection by 2x, and the θ deflection by 10x. This demonstrates that the NN assembly is highly effective at canceling effects of first order gradient forces. It is noteworthy as well that the Y and θ deflection are very small for both assemblies. This is somewhat anticipated, because an antiparallel configuration imposes only first order gradient fields without $0^{th}$ or second order gradient fields.

Referring now to FIG. 17, further experimentation was done on a fourth exemplary magnet assembly 1700 which uses the configuration of assembly 1302. On the left, the assembly 1700 is shown with a magnet pair 1702 in an "NS" arrangement while on the right the assembly is shown with the magnet pair 1702 in an "NN" arrangement. In this instance, we sweep the position of the magnet pair 1702 and keep a constant current from a coil 1704.

Figures 18A, 18B:
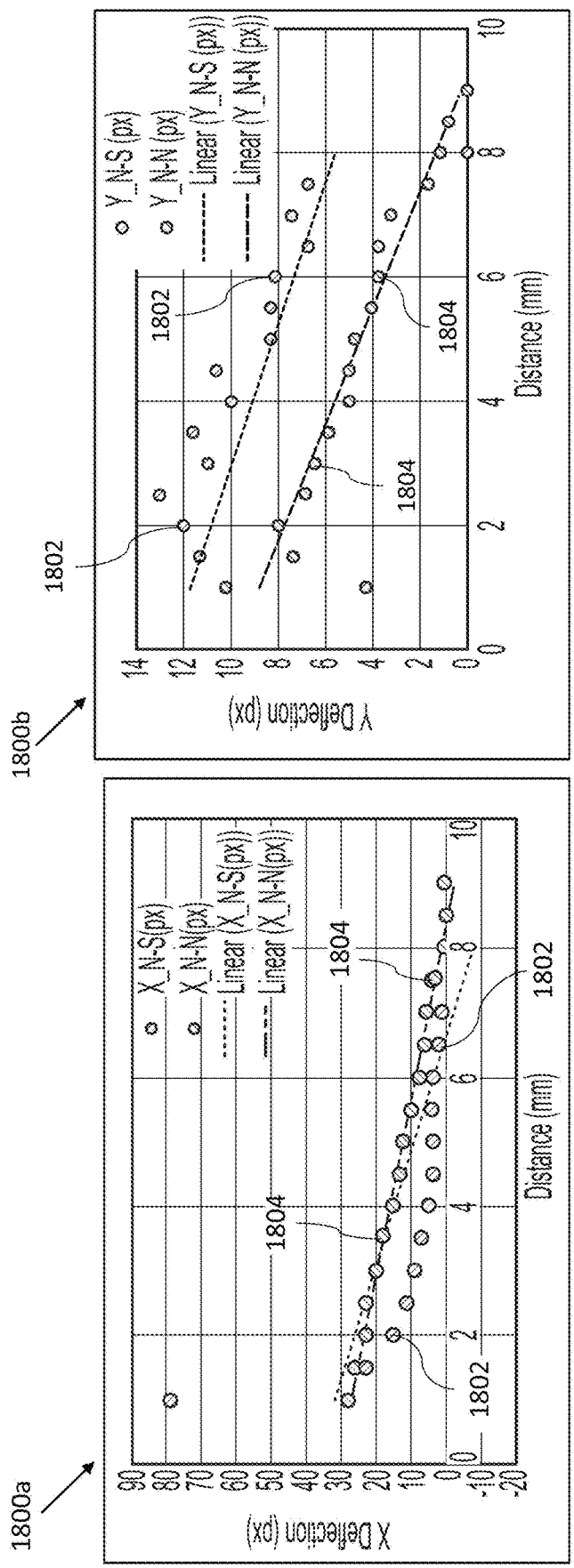
FIGS. 18a, 18b, and 18c are graphs of data obtained using the magnet assemblies of FIG. 17.
Figure 18C:
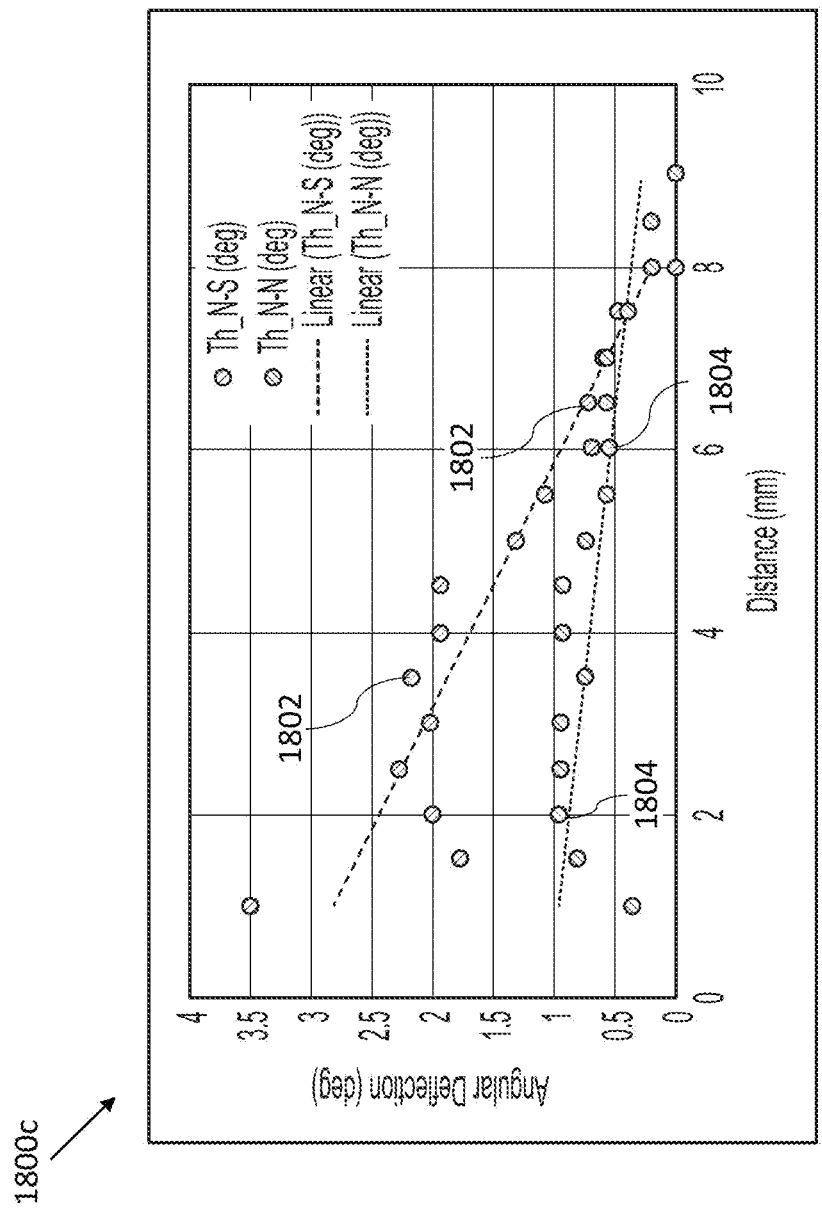

Deflection of the magnet pairs 1702 is recorded for analysis in the graphs 1800a, 1800b, 1800c of FIGS. 18a-18c. Graph points 1802 represent the assembly 1700 when the magnets are positioned in an "NS" arrangement, while graph points 1804 represent the assembly 1700 when the magnets are positioned in an "NN" arrangement. Graph 1800a represents deflection along the x axis, graph 1800b represents deflection along the y axis, and graph 1800c is θ deflection. The spatial profiles of Y and θ deflections are similar and small. The NN arrangement appears to reduce deflection by 2x in both. Any deflections of the assemblies here is attributed to fabrication misalignment on the posts.

The spatial profile of X deflection for both assemblies is the most interesting. The NS assembly experiences a deflection that has an exponential relationship with the distance of the magnets 1702 from the coil 1704. This is expected, as the coil 1704 contains higher order gradients in its magnetic field profile. The X-deflection of the NN assembly is very different however. This NN assembly records a linear relationship with distance from the coil. This indicates that this assembly is not sensitive to $0^{th}$ and first order gradients, and it also indicates that there are extremely smaller third order and higher gradients in this magnetic field profile, if any ($3^{rd}$ order gradients would make this relationship also look exponential). Therefore using our methods and electromagnetic system, the fabricated NN assembly is selectively sensitive to second order gradient magnetic fields.

It is noteworthy that some magnetocardiography articles have discussed the utility of a three-dimensional gradient, d(dB/dz)dx, where z is orthogonal to the biomagnetic source and x is in a parallel plane. This variable is directly proportional to the intuitive ionic current flow in the heart and so directly sensing this variable may greatly minimize requirements for post processing. In order to measure this quantity today, one would need information from 4 to 6 sensors. We propose a system using two sensors FIG. 19, and a system using a single sensor in FIG. 20.

Figure 19:
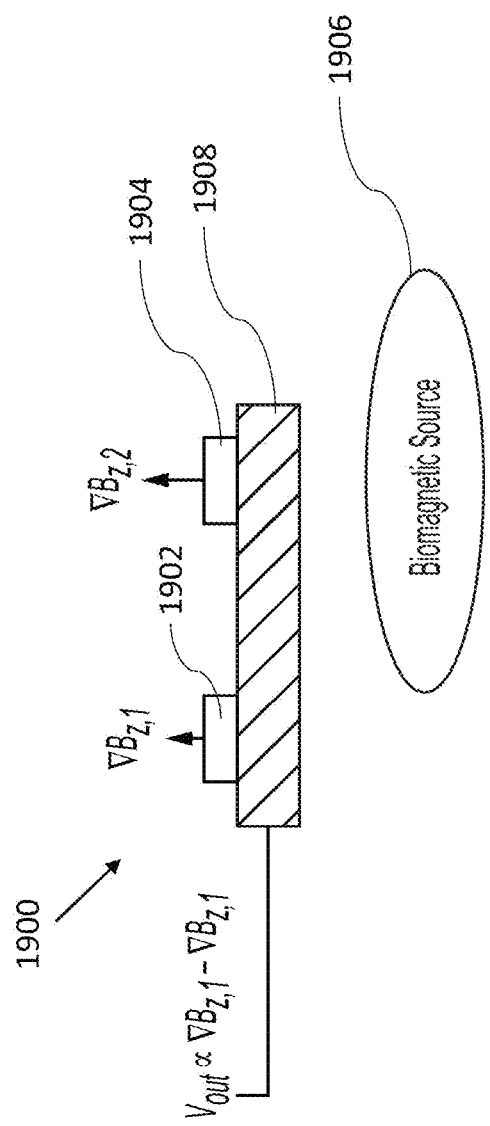
FIG. 19 is a schematic diagram of a gradiometer measuring a biomagnetic source, in accordance with the subject technology.

Using our unique single-point gradiometer designs, this variable of a biomagnetic source 1906 could be measured by the system 1900 illustrated in FIG. 19. The system 1900 includes two order gradiometers 1902, 1904 next to each other on the same chip 1908 (which can include a sensing system, and other components of the gradiometer discussed herein). These vector sensors 1902, 1904 are oriented along an axis orthogonal to the heart. A subtraction between these sensors 1902, 1904 would yield this variable.

Figure 20:
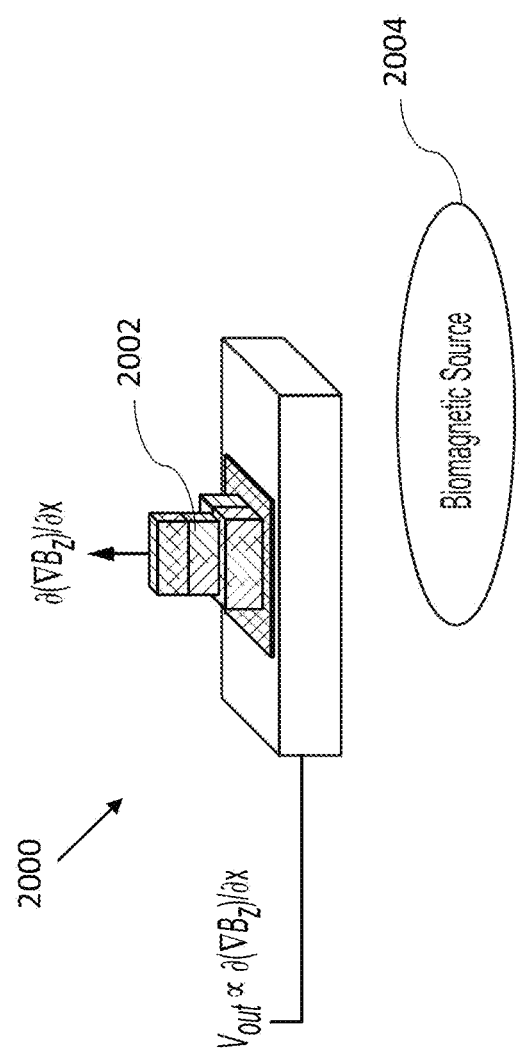
FIG. 20 is a schematic diagram of another gradiometer measuring a biomagnetic source, in accordance with the subject technology.

Referring now to FIG. 20, an alternative system 2000 is shown, which will feel a force proportional to a planar gradient Bz. In the system 2000, we combine our abilities to fabricate unique micromagnet arrays with our abilities to functionalize MEMS platforms with foreign materials structures. Similar to how back-to-back magnets that are rigidly fixed will cancel torsional and direct forces, it is straightforward to carry these principles into the design of an array 2002, for which a direct force (e.g. from a biomagnetic source 2004) is proportional to the variable of interest.

Overall, the disclosure herein provides a system and method for measuring magnetic gradients of the second order or greater. In some cases, the force felt by the sensors disclosed herein will be directly proportional to the magnetic field gradient.

All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements) shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed.

What is claimed is:

1. A gradiometer for measuring a gradient of an external magnetic field comprising:
a first magnet and a second magnet mechanically coupled together and aligned along a polarization axis, the first magnet and the second magnet being positioned such that a pair of like magnetic poles of the first magnet and the second magnet face in opposite directions, wherein the first magnet and the second magnet are configured to move along the polarization axis in response to the external magnetic field;
a sensing system configured to measure a change in the gradient of the external magnetic field based on the movement of the first magnet and second magnet along the polarization axis in response to the external magnetic field.

2. The gradiometer of claim 1, wherein the change in a gradient of the external magnetic field is a second order gradient.

3. The gradiometer of claim 1, wherein the change in the gradient of the external magnetic field is a higher-than-second order gradient.

4. The gradiometer of claim 1, further comprising a third magnet mechanically coupled to the second magnet on a side opposite the first magnet to move along the polarization axis, wherein the third magnet is positioned such that a pair of like magnetic poles of the third magnet and the second magnet face in opposite directions, wherein the change in the gradient of the external magnetic field is a third order gradient.

5. The gradiometer of claim 1, wherein the first magnet and the second magnet are positioned with a separation distance of substantially (i.e. +/–10%) 2 mm therebetween.

6. The gradiometer of claim 1, wherein the sensing system is a microscope, and the change in gradient is determined based on a change in deflection of the first magnet and/or the second magnet along the polarization axis measured by the microscope.

7. The gradiometer of claim 1, wherein the first magnet and the second magnet are configured to move in mechanical resonance.

8. A method of determining a change in a gradient of an external magnetic field, comprising:
positioning and mechanically coupling a first magnet and a second magnet such that they move together along a polarization axis in response to the external magnetic field, the first magnet and the second magnet aligned along the polarization axis with like magnetic facing in opposite directions,
measuring, with a sensing system, the change in the gradient of the external magnetic field based on the movement of the first magnet and the second magnet along the polarization axis in response to the external magnetic field.

9. The method of claim 8, wherein the change in the gradient of the external magnetic field is a second order gradient.

10. The method of claim 8, wherein the change in the gradient of the external magnetic field is a higher-than-second order gradient.

11. The method of claim 8, further comprising mechanically coupling a third magnet to the second magnet on a side opposite the first magnet to move together with the second magnet along the polarization axis, wherein:
the third magnet is positioned such that a pair of like magnetic poles of the third magnet and the second magnet face in opposite directions; and
the change in the gradient of the external magnetic field is a third order gradient.

12. The method of claim 8, wherein the first magnet and the second magnet are positioned with a separation distance of substantially (i.e. +/–10%) 2 mm therebetween.

13. The method of claim 8, wherein the sensing system is a microscope, measuring the change in the gradient of the external magnetic field includes determining, with the microscope, a change in deflection of the first magnet and/or the second magnet along the polarization axis, wherein the change in the gradient of the external magnetic field is determined based on the change in deflection.

14. A method of assembling a magnet array for a gradiometer comprising:
attaching a first magnet to a top surface of a first transparent substrate, the first transparent substrate having a greater width than the first magnet;
attaching a second magnet to a top surface of a second transparent substrate, the second transparent substrate having a greater width than the second magnet;
positioning the second magnet over the first magnet along a dipole axis;
aligning the first magnet and the second magnet along the dipole axis by viewing the first magnet and second magnet with a microscope from a position directly above the second magnet along the dipole axis and adjusting the position of the first magnet and/or the second magnet;
placing epoxy on top of the first magnet; and
lowering the second magnet onto the first magnet while continuing to view the first magnet and the second magnet with the microscope to maintain alignment along the dipole axis.

15. The method of claim 14, wherein:
the epoxy is UV curable epoxy which is cured with UV radiation to attach the first magnet and the second magnet;
the first magnet is held to the first transparent substrate with cured UV epoxy; and
the second magnet is held to the second transparent substrate with cured UV epoxy.

16. The method of claim 14, wherein the first transparent substrate is a glass coverslip and the second transparent substrate is a glass coverslip.

17. The method of claim 16, further comprising, after the step of lowering the second magnet onto the first magnet:
curing the epoxy to attach the first magnet to the second magnet;
breaking and removing the first transparent substrate from the first magnet; and
breaking and removing the second transparent substrate from the second magnet.

18. The method of claim 14, wherein the second magnet is attached to the second transparent substrate with a like polar orientation to the first magnet.

19. The method of claim 14, wherein the first magnet is substantially the same size as the second magnet.

* * * * *